United States Patent
Lee et al.

(10) Patent No.: US 12,527,136 B2
(45) Date of Patent: Jan. 13, 2026

(54) DISPLAY APPARATUS

(71) Applicant: Samsung Display Co., Ltd., Yongin-si (KR)

(72) Inventors: Dooyoung Lee, Yongin-si (KR); Bogyeong Kim, Yongin-si (KR); Takyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 397 days.

(21) Appl. No.: 18/118,643

(22) Filed: Mar. 7, 2023

(65) Prior Publication Data

US 2023/0402577 A1    Dec. 14, 2023

(30) Foreign Application Priority Data

Jun. 9, 2022  (KR) .................. 10-2022-0070294

(51) Int. Cl.
    *H10H 20/857*    (2025.01)
    *H01L 25/075*    (2006.01)
    *H10H 20/851*    (2025.01)

(52) U.S. Cl.
    CPC ....... *H10H 20/857* (2025.01); *H01L 25/0753* (2013.01); *H10H 20/8514* (2025.01)

(58) Field of Classification Search
    None
    See application file for complete search history.

(56) References Cited

U.S. PATENT DOCUMENTS

| | | | |
|---|---|---|---|
| 2018/0129093 A1* | 5/2018 | Hong | .......... H10K 59/131 |
| 2018/0190233 A1* | 7/2018 | Jang | .......... G09G 3/3688 |
| 2019/0288008 A1 | 9/2019 | Park et al. | |
| 2021/0043717 A1 | 2/2021 | Park et al. | |
| 2021/0065642 A1 | 3/2021 | Shin et al. | |
| 2021/0333607 A1 | 10/2021 | Shin et al. | |

FOREIGN PATENT DOCUMENTS

| | | |
|---|---|---|
| KR | 10-0681039 B1 | 2/2007 |
| KR | 10-2019-0110166 A | 9/2019 |
| KR | 10-2021-0018572 A | 2/2021 |
| KR | 10-2021-0025759 A | 3/2021 |
| KR | 10-2021-0131503 A | 11/2021 |

* cited by examiner

*Primary Examiner* — Nicholas J Lee
(74) *Attorney, Agent, or Firm* — Womble Bond Dickinson (US) LLP

(57) ABSTRACT

A display apparatus includes: a substrate defining a display area, and a peripheral; first and second conductive lines sequentially located along a first direction on one side of the peripheral area, the first and second conductive lines each extending in a second direction crossing the first direction; first and second stages located along the second direction on one side of the peripheral area; a first connection line extending in the first direction, and connecting the first conductive line to the first stage; a second connection line extending in the first direction, and connecting the second conductive line to the second stage; and a first auxiliary line extending in the first direction from the first conductive line, and connected to the second connection line. A first length of the first connection line in the first direction is greater than a second length of the second connection line in the first direction.

20 Claims, 11 Drawing Sheets

DISPLAY APPARATUS

CROSS-REFERENCE TO RELATED APPLICATION

This application claims priority to and the benefit of Korean Patent Application No. 10-2022-0070294, filed on Jun. 9, 2022, in the Korean Intellectual Property Office, the entire disclosure of which is incorporated by reference herein.

BACKGROUND

1. Field

Aspects of one or more embodiments of the present disclosure relate to a display apparatus.

2. Description of the Related Art

A display apparatus visually displays images. A display apparatus is used as a display unit of miniaturized products, such as mobile phones, and used as a display unit of large-scale products, such as televisions.

Recently, the usage of display apparatuses has diversified. In addition, as display apparatuses have become thinner and lighter, their range of use has gradually been expanded. Recently, as the purposes of display apparatuses become more diverse, various designs to improve the quality of display apparatuses have been attempted.

The above information disclosed in this Background section is for enhancement of understanding of the background of the present disclosure, and therefore, it may contain information that does not constitute prior art.

SUMMARY

A display apparatus includes a substrate divided into a display area and a non-display area. A gate line and a data line are insulated from each other, and formed at (e.g., in or on) the display area. A plurality of pixel regions are defined at (e.g., in or on) the display area. To display images to the outside, pixels arranged in the plurality of pixel regions, respectively, are configured to receive electrical signals from the gate line and the data line, which cross each other, to emit light. A thin-film transistor, and a pixel electrode electrically connected to the thin-film transistor are provided in each of the pixel regions. An opposite electrode is provided in the pixel regions in common. Various wirings, and pads to which a gate driver, a data driver, and a controller may be connected, may be provided at (e.g., in or on) the non-display area. The various wirings are configured to transfer electrical signals to the pixels within the display area.

One or more embodiments of the present disclosure are directed to a display apparatus having a reduced deviation in a signal delay for a signal applied to a display area, and thus, may prevent or substantially prevent horizontal line smudge defects due to a difference in the signal delay.

However, the aspects and features of the present disclosure are not limited to those above, and other aspects and features may be clearly understood by those having ordinary skill in the art by referring to the detailed description of the present disclosure with reference to the figures.

Additional aspects and features of the present disclosure will be set forth, in part, in the description that follows, and in part, will be apparent from the description, or may be learned by practicing one or more of the presented embodiments of the present disclosure.

According to one or more embodiments of the present disclosure, a display apparatus includes: a substrate defining a display area, and a peripheral area outside the display area; first and second conductive lines sequentially located along a first direction on one side of the peripheral area, the first and second conductive lines each extending in a second direction crossing the first direction; first and second stages located along the second direction on one side of the peripheral area; a first connection line extending in the first direction, and connecting the first conductive line to the first stage; a second connection line extending in the first direction, and connecting the second conductive line to the second stage; and a first auxiliary line extending in the first direction from the first conductive line, and connected to the second connection line. A first length of the first connection line in the first direction is greater than a second length of the second connection line in the first direction.

In an embodiment, the first length of the first connection line may be equal to a sum of the second length of the second connection line and a first auxiliary length of the first auxiliary line in the first direction.

In an embodiment, the display apparatus may further include: a third conductive line between the second conductive line and the first and second stages, and extending in the second direction; a third stage on one side of the peripheral area; a third connection line extending in the first direction, and connecting the third conductive line to the third stage; and a second auxiliary line extending in the first direction from the first conductive line, and connected to the third connection line. A first auxiliary length of the first auxiliary line in the first direction may be less than a second auxiliary length of the second auxiliary line in the first direction.

In an embodiment, the second length of the second connection line may be greater than a third length of the third connection line in the first direction.

In an embodiment, the first length of the first connection line may be equal to a sum of the second length of the second connection line and the first auxiliary length of the first auxiliary line, and the first length of the first connection line may be equal to a sum of a third length of the third connection line in the first direction and a second auxiliary length of the second auxiliary line in the first direction.

In an embodiment, the display apparatus may further include a plurality of pixels at the display area, each of the plurality of pixels including: a light-emitting element having an anode and a cathode; a driving transistor configured to control a magnitude of a driving current flowing through the light-emitting element; a scan transistor configured to transfer a data voltage to a gate of the driving transistor in response to a scan signal; and a sensing transistor configured to transfer a sensing voltage or an initialization voltage to the anode of the light-emitting element in response to a sensing signal. The first to third conductive lines may be configured to transfer scan clock signals or sensing clock signals to the first to third stages, respectively, through the first to third connection lines, and the first to third stages may be configured to output scan signals or sensing signals, based on the scan clock signals or the sensing clock signals.

In an embodiment, the display apparatus may further include: third and fourth conductive lines sequentially located along the first direction on one side of the peripheral area, the third and fourth conductive lines each extending in the second direction; a third connection line extending in the first direction, and connecting the third conductive line to the first stage; and a fourth connection line extending in the first direction, and connecting the fourth conductive line to the second stage. The first and second conductive lines may be located between the third and fourth conductive lines and the first and second stages, and a value of a first fringe capacitance formed between the first connection line and the third connection line may be equal to a value of a second fringe capacitance formed between the second connection line, the first auxiliary line, and the fourth connection line.

In an embodiment, the display apparatus may further include: third and fourth conductive lines sequentially located along the first direction on one side of the peripheral area, the third and fourth conductive lines each extending in the second direction; a third connection line extending in the first direction, and connecting the third conductive line to the first stage; a fourth connection line extending in the first direction, and connecting the fourth conductive line to the second stage; a second auxiliary line extending in the first direction from the third conductive line, and connected to the fourth connection line; and a plurality of pixels at the display area. Each of the plurality of pixels may include: a light-emitting element having an anode and a cathode; a driving transistor configured to control a magnitude of a driving current flowing through the light-emitting element; a scan transistor configured to transfer a data voltage to a gate of the driving transistor in response to a scan signal; and a sensing transistor configured to transfer a sensing voltage or an initialization voltage to the anode of the light-emitting element in response to a sensing signal. The first and second conductive lines may be configured to transfer one of scan clock signals or sensing clock signals to the first and second stages, respectively, through the first and second connection lines, the third and fourth conductive lines may be configured to transfer another one from among the scan clock signals or the sensing clock signals to the first and second stages, respectively, through the third and fourth connection lines, and the first and second stages may be configured to output scan signals based on the scan clock signals, and sensing signals based on the sensing clock signals.

In an embodiment, the first length of the first connection line may be equal to a sum of the second length of the second connection line and a first auxiliary length of the first auxiliary line in the first direction, and a third length of the third connection line in the first direction may be equal to a sum of a fourth length of the fourth connection line in the first direction and a second auxiliary length of the second auxiliary line in the first direction.

In an embodiment, the display apparatus may further include: fifth and sixth conductive lines sequentially located along the first direction on one side of the peripheral area, the fifth and sixth conductive lines each extending in the second direction; a fifth connection line extending in the first direction, and connecting the fifth conductive line to the first stage; and a sixth connection line extending in the first direction, and connecting the sixth conductive line to the second stage. The first and second conductive lines may be located between the fifth and sixth conductive lines and the first and second stages, and the third and fourth conductive lines may be located between the first and second conductive lines and the first and second stages. A value of a first fringe capacitance formed by the first connection line and the fifth connection line may be equal to a value of a second fringe capacitance formed by the second connection line, the first auxiliary line, and the sixth connection line, and a value of a third fringe capacitance formed by the first connection line, the third connection line, and the fifth connection line may be equal to a value of a fourth fringe capacitance formed by the second connection line, the fourth connection line, the second auxiliary line, and the sixth connection line.

In an embodiment, the display apparatus may further include: a transistor at the display area, and including a semiconductor layer, and a gate electrode on the semiconductor layer; a buffer layer between the substrate and the semiconductor layer; and an interlayer insulating layer on the gate electrode. Each of the first and second conductive lines may include a lower conductive line and an upper conductive line, the lower conductive line being located between the substrate and the buffer layer, and the upper conductive line being located on the interlayer insulating layer to overlap with the lower conductive line and electrically connected to the lower conductive line.

In an embodiment, each of the lower conductive lines may have a plurality of first openings exposing at least a portion of the substrate, and each of the upper conductive lines may have a plurality of second openings corresponding to the plurality of first openings, respectively.

In an embodiment, the first connection line, the second connection line, and the first auxiliary line may be located at a same layer as that of the lower conductive line.

In an embodiment, the second connection line and the first auxiliary line may be one body.

In an embodiment, the display apparatus may further include: a first light-emitting element, a second light-emitting element, and a third light-emitting element at the display area, and each including a first-color emission layer; a transmissive layer on the first light-emitting element; a second-color quantum dot layer and a third-color quantum dot layer on the second light-emitting element and the third light-emitting element, respectively; and a first-color color filter layer, a second-color color filter layer, and a third-color color filter layer on the transmissive layer, the second-color quantum dot layer, and the third-color quantum dot layer, respectively.

According to one or more embodiments of the present disclosure, a display apparatus includes: a substrate defining a display area, and a peripheral area outside the display area; first to fourth conductive lines sequentially located along a first direction on one side of the peripheral area, the first to fourth conductive lines each extending in a second direction crossing the first direction; first and second stages located along the second direction on one side of the peripheral area; a first connection line extending in the first direction, and connecting the first conductive line to the first stage; a second connection line extending in the first direction, and connecting the second conductive line to the second stage; a third connection line extending in the first direction, and connecting the third conductive line to the first stage; a fourth connection line extending in the first direction, and connecting the fourth conductive line to the second stage; and an auxiliary line extending in the first direction from the third conductive line, and connected to the fourth connection line. A value of a first fringe capacitance formed between the first connection line and the third connection line is equal to a value of a second fringe capacitance formed between the second connection line, the fourth connection line, and the auxiliary line.

In an embodiment, the display apparatus may further include a plurality of pixels at the display area, each of the plurality of pixels including: a light-emitting element having an anode and a cathode; a driving transistor configured to control a magnitude of a driving current flowing through the light-emitting element; a scan transistor configured to transfer a data voltage to a gate of the driving transistor in response to a scan signal; and a sensing transistor configured to transfer a sensing voltage or an initialization voltage to the anode of the light-emitting element in response to a sensing signal. The first and second conductive lines may be configured to transfer carry clock signals to the first and second stages, respectively, through the first and second connection lines, the third and fourth conductive lines may be configured to transfer scan clock signals or sensing clock signals to the first and second stages, respectively, through the third and fourth connection lines, and the first and second stages may be configured to output scan signals or sensing signals, based on the scan clock signals or the sensing clock signals.

In an embodiment, a first length of the first connection line in the first direction may be greater than a second length of the second connection line in the first direction, and a third length of the third connection line in the first direction may be equal to a sum of a fourth length of the fourth connection line in the first direction and an auxiliary length of the auxiliary line in the first direction.

In an embodiment, the fourth connection line and the auxiliary line may be one body.

In an embodiment, the display apparatus may further include: a first light-emitting element, a second light-emitting element, and a third light-emitting element at the display area, and each including a first-color emission layer; a transmissive layer on the first light-emitting element; a second-color quantum dot layer and a third-color quantum dot layer on the second light-emitting element and the third light-emitting element, respectively; and a first-color color filter layer, a second-color color filter layer, and a third-color color filter layer on the transmissive layer, the second-color quantum dot layer, and the third-color quantum dot layer, respectively.

The above and/or other aspects and features of the present disclosure will become more apparent and more readily appreciated from the following detailed description, the accompanying drawings, and the claims and their equivalents.

The above general and specific aspects and features of the present disclosure may be implemented by using a system, a method, a computer program, or a combination of the system, the method, and the computer program.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
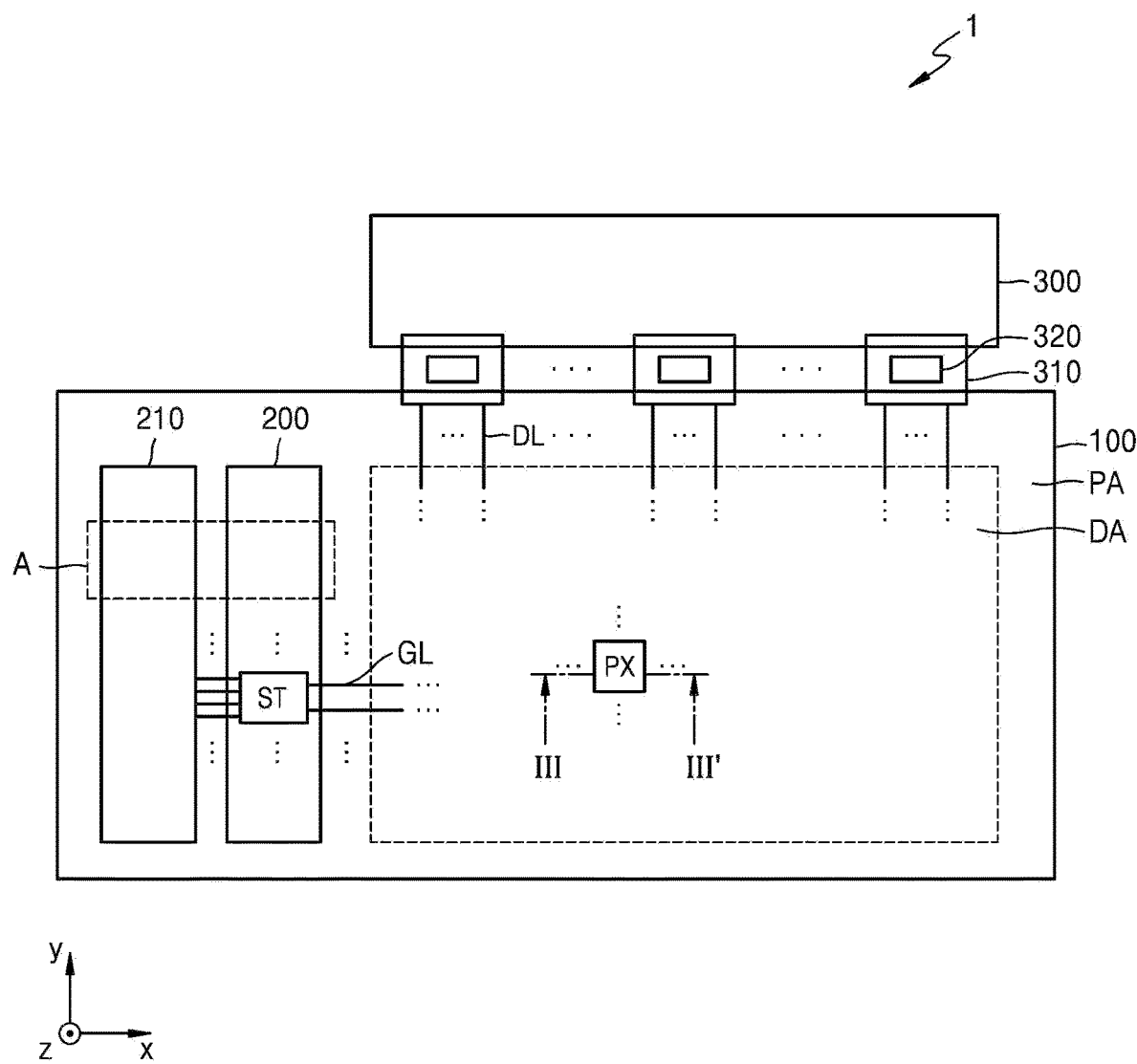
FIG. 1 is a schematic block diagram of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic block diagram of a display apparatus 1 according to an embodiment.

Referring to FIG. 1, the display apparatus 1 may include a substrate 100, a gate driver 200, a clock wiring portion 210, a printed circuit board (PCB) 300, a flexible PCB (FPCB) 310, and a data driver 320.

The substrate 100 may include a display area DA, and a peripheral area PA outside the display area DA. The display area DA is a region where (e.g., in or on which) images are displayed. A pixel PX may be arranged at (e.g., in or on) the display area DA. The pixel PX may include at least one thin-film transistor, and a light-emitting element. The peripheral area PA is a region where (e.g., in or on which) images are not displayed. A gate line GL, a data line DL, the gate driver 200, and the clock wiring portion 210 are configured to apply a voltage, a signal, and/or the like to the pixel PX at (e.g., in or on) the display area DA, and may be arranged at (e.g., in or on) the peripheral area PA.

One side of the peripheral area PA may be bonded to the FPCB 310, and connected to the PCB 300. The data driver 320 mounted on the FPCB 310 may be configured to transfer a data signal (e.g., a data voltage) to the pixel PX in the display area DA through the data line DL. As shown in FIG. 1, the gate line GL may extend in a first direction (e.g., a ±x direction), and may be connected to the pixel PX at (e.g., in or on) the display area DA. The data line DL may extend in a second direction (e.g., a ±y direction), and may be connected to the pixel PX at (e.g., in or on) the display area DA.

The gate driver 200 may be arranged in the second direction (e.g., the ±y direction) on one side of the peripheral area PA. The gate driver 200 may be integrated in the peripheral area PA. The gate driver 200 may include a plurality of stages ST configured to sequentially output gate signals to the gate line GL. Each stage ST may be connected to at least one gate line GL, and may be configured to transfer a gate signal to the pixel PX.

The clock wiring portion 210 may be arranged in the second direction (e.g., the ±y direction) on one side of the peripheral area PA. The clock wiring portion 210 may be integrated in the peripheral area PA. The clock wiring portion 210 may be configured to transfer a clock signal to the stage ST of the gate driver 200. As an example, as described in more detail below with reference to FIG. 3, the clock wiring portion 210 may include a carry clock signal line CR, a scan clock signal line SC, a sensing clock signal line SS, and a global clock signal line GB. The carry clock signal line CR may be configured to transfer a carry clock signal CLK_CR to the stage ST of the gate driver 200. The scan clock signal line SC may be configured to transfer a scan clock signal CLK_SC to the stage ST of the gate driver 200. The sensing clock signal line SS may be configured to transfer a sensing clock signal CLK_SS to the stage ST of the gate driver 200. The global clock signal line GB may be configured to transfer a global clock signal CLK_GB to the stage ST of the gate driver 200.

The PCB 300, which may be located on one side of the FPCB 310, may include a signal controller. The signal controller may be configured to generate various suitable kinds of signals for displaying images at (e.g., in or on) the display area DA, and may transfer control signals to the gate driver 200, the clock wiring portion 210, and the data driver 320, to control the gate driver 200, the clock wiring portion 210, and the data driver 320.

Figure 2:
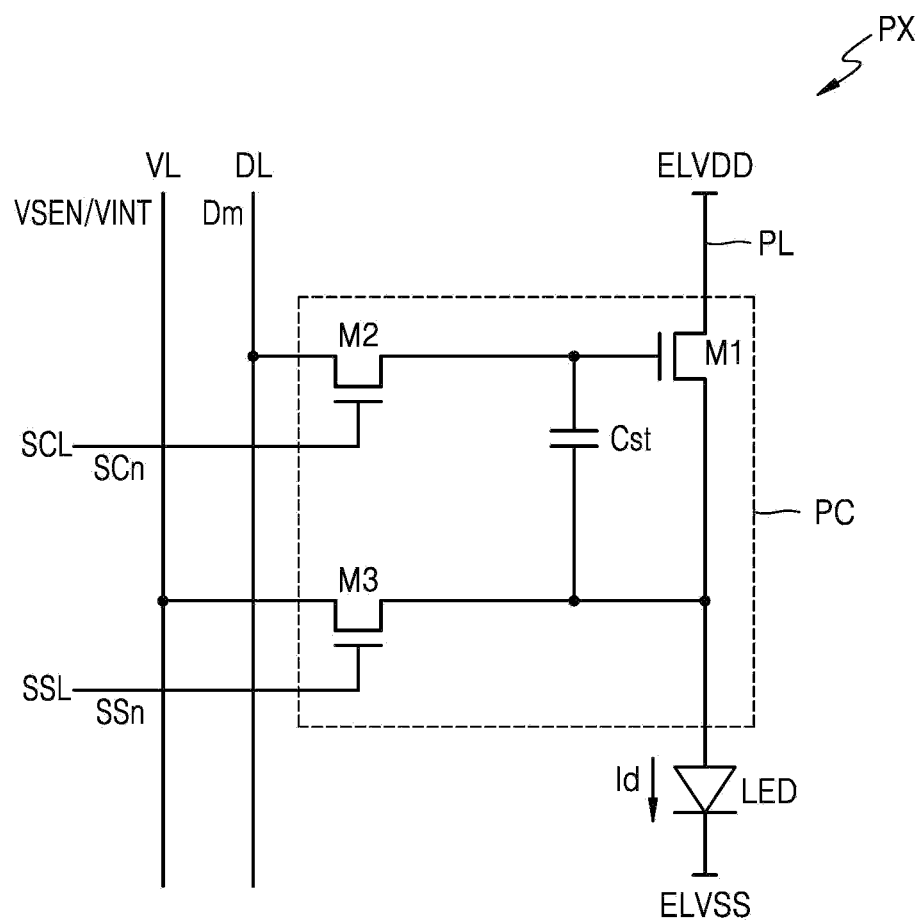
FIG. 2 is an equivalent circuit diagram of a pixel according to an embodiment.

FIG. 2 is an equivalent circuit diagram of a pixel PX according to an embodiment.

Referring to FIG. 2, the pixel PX may include a pixel circuit PC, and a light-emitting element LED electrically connected to the pixel circuit PC. The pixel circuit PC may be connected to a scan line SCL configured to transfer a scan signal SCn, a sensing line SSL configured to transfer a sensing signal SSn, a sensing voltage line VL configured to transfer a sensing voltage VSEN or an initialization voltage VINT, the data line DL configured to transfer a data voltage Dm, and a driving voltage line PL configured to transfer a first driving voltage ELVDD. The pixel circuit PC may include a first transistor M1, a second transistor M2, a third transistor M3, and a storage capacitor Cst. The light-emitting element LED may be an organic light-emitting diode OLED. A cathode of the light-emitting element LED may be a common electrode to which a second driving voltage ELVSS is applied. The scan line SCL corresponds to some of the gate lines GL of FIG. 1, and the sensing line SSL corresponds to other gate lines GL of FIG. 1.

The first transistor M1 may be a driving transistor in which the magnitude of a drain current is determined according to a gate-source voltage. The second transistor M2 and the third transistor M3 may be switching transistors that are turned on/off according to a gate-source voltage, or substantially, a gate voltage thereof. The first transistor M1, the second transistor M2, and the third transistor M3 may be formed as thin-film transistors. The first transistor M1, the second transistor M2, and the third transistor M3 may be formed as n-channel metal oxide semiconductor (NMOS) field effect transistors (FET) (MOSFETs).

Each of the first transistor M1, the second transistor M2, and the third transistor M3 may be an oxide semiconductor thin-film transistor that includes a semiconductor layer including an oxide semiconductor, or may be a silicon semiconductor thin-film transistor that includes a semiconductor including polycrystalline silicon.

The first transistor M1 may be denoted as a driving transistor, the second transistor M2 may be denoted as a scan transistor, and the third transistor M3 may be denoted as a sensing transistor or an initialization transistor.

The storage capacitor Cst may be connected between a gate of the driving transistor M1 and an anode of the light-emitting element LED. The storage capacitor Cst may include a first electrode connected to the gate of the driving transistor M1, and a second electrode connected to the anode of the light-emitting element LED.

The driving transistor M1 may be configured to control the magnitude of a driving current Id flowing from the driving voltage line PL to the light-emitting element LED according to the gate-source voltage thereof. The light-emitting element LED may be configured to emit light having a desired brightness (e.g., a predetermined or preset brightness) corresponding to the driving current Id. The driving transistor T1 may include a gate connected to the first electrode of the storage capacitor Cst, a drain connected to the driving voltage line PL, and a source connected to the light-emitting element LED.

The scan transistor M2 may connect the data line DL to the driving transistor M1 in response to a scan signal SCn. The scan transistor M2 may be configured to transfer the data voltage Dm to the driving transistor M1 in response to the scan signal SCn. As an example, the scan transistor M2 may connect the data line DL to the gate of the driving transistor M1 in response to the scan signal SCn. The scan transistor M2 may be configured to transfer the data voltage Dm to the gate of the driving transistor M1 in response to the scan signal SCn.

The sensing transistor M3 may be configured to connect the sensing voltage line VL to the anode of the light-emitting element LED in response to a sensing signal SSn. The sensing transistor M3 may be configured to transfer the sensing voltage VSEN or the initialization voltage VINT to the anode of the light-emitting element LED in response to the sensing signal SSn.

While FIG. 2 illustrates an example in which the driving transistor M1, the switching transistor M2, and the sensing transistor M3 are NMOSFETs, the present disclosure is not limited thereto. As another example, at least one of the driving transistor M1, the switching transistor M2, and the sensing transistor M3 may be formed as a PMOSFET.

While FIG. 2 illustrates an example in which the pixel circuit PC includes three transistors and one storage capacitor, the present disclosure is not limited thereto. As another example, the pixel circuit PC may include seven transistors and one storage capacitor.

Figure 3:
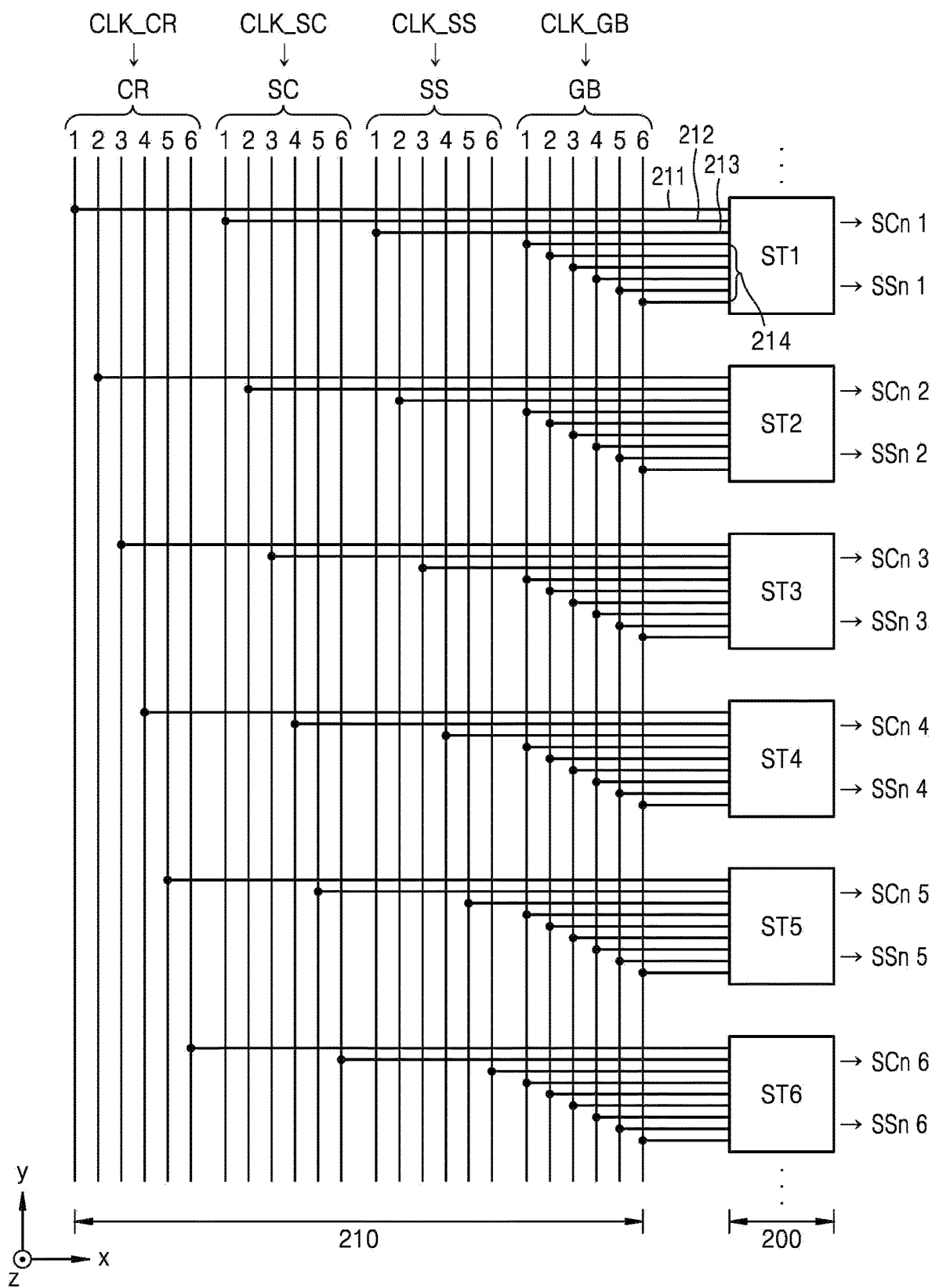
FIG. 3 is a schematic block diagram of a clock wiring portion and a gate driver, according to an embodiment.

FIG. 3 is a schematic block diagram of the clock wiring portion 210 and the gate driver 200, according to an embodiment.

Referring to FIG. 3, the clock wiring portion 210 may include a plurality of carry clock signal lines CR, a plurality of scan clock signal lines SC, a plurality of sensing clock signal lines SS, and a plurality of global clock signal lines GB. The plurality of carry clock signal lines CR, the plurality of scan clock signal lines SC, the plurality of sensing clock signal lines SS, and the plurality of global clock signal lines GB may each extend in the second direction (e.g., the ±y direction).

The plurality of scan clock signal lines SC may be arranged on the right of the plurality of carry clock signal lines CR. The plurality of sensing clock signal lines SS may be arranged on the right of the plurality of scan clock signal lines SC. The plurality of global clock signal lines GB may be arranged on the right of the plurality of sensing clock signal lines SS. According to an embodiment, the positions of the plurality of carry clock signal lines CR, the plurality of scan clock signal lines SC, the plurality of sensing clock signal lines SS, and the plurality of global clock signal lines GB, may be variously modified as needed or desired. In addition, while FIG. 3 illustrates that the clock wiring portion 210 includes six carry clock signal lines CR, six scan clock signal lines SC, six sensing clock signal lines SS, and six global clock signal lines GB, the number of signal lines may be variously modified as needed or desired.

For convenience of illustration, first to sixth carry clock signal lines CR1, CR2, CR3, CR4, CR5, CR6 are shown as 1, 2, 3, 4, 5, and 6 below the reference symbol CR. First to sixth scan clock signal lines SC1, SC2, SC3, SC4, SC5, SC6, first to sixth sensing clock signal lines SS1, SS2, SS3, SS4, SS5, SS6, and first to sixth global clock signal lines GB1, GB2, GB3, GB4, GB5, and GB6 are also shown in the same corresponding manner.

The first to sixth carry clock signal lines CR1, CR2, CR3, CR4, CR5, and CR6 may be spaced apart from each other by a suitable distance (e.g., a predetermined or preset distance). The first carry clock signal line CR1 may be electrically connected to a carry clock signal connection line 211 extending in the first direction (e.g., the ±x direction). The carry clock signal connection line 211 may be connected to a first stage ST1, and may be configured to transfer a first carry clock signal CLK_CR1 from the first carry clock signal line CR1 to the first stage ST1. The same or substantially the same description as that of the first carry clock signal line CR1 above may be applied to the second to sixth carry clock signal lines CR2, CR3, CR4, CR5, and CR6. As an example, as shown in FIG. 3, the second carry clock signal line CR2 may be configured to transfer a second carry clock signal CLK_CR2 to a second stage ST2 through the carry clock signal connection line 211 connected to the second stage ST2. The third carry clock signal line CR3 may be configured to transfer a third carry clock signal CLK_CR3 to a third stage ST3 through the carry clock signal connection line 211 connected to the third stage ST3. The fourth carry clock signal line CR4 may be configured to transfer a fourth carry clock signal CLK_CR4 to a fourth stage ST4 through the carry clock signal connection line 211 connected to the fourth stage ST4. The fifth carry clock signal line CR5 may be configured to transfer a fifth carry clock signal CLK_CR5 to a fifth stage ST5 through the carry clock signal connection line 211 connected to the fifth stage ST5. The sixth carry clock signal line CR6 may be configured to transfer a sixth carry clock signal CLK_CR6 to a sixth stage ST6 through the carry clock signal connection line 211 connected to the sixth stage ST6.

The first to sixth scan clock signal lines SC1, SC2, SC3, SC4, SC5, and SC6 may be spaced apart from each other by a suitable distance (e.g., a predetermined or preset distance). The first scan clock signal line SC1 may be electrically connected to a scan clock signal connection line 212 extending in the first direction (e.g., the ±x direction). The scan clock signal connection line 212 may be connected to the first stage ST1, and may be configured to transfer a first scan clock signal CLK_SC1 from the first scan clock signal line SC1 to the first stage ST1. The same or substantially the same description as that of the first scan clock signal line SC1 above may be applied to the second to sixth scan clock signal lines SC2, SC3, SC4, SC5, and SC6. As an example, as shown in FIG. 3, the second scan clock signal line SC2 may be configured to transfer a second scan clock signal CLK_SC2 to the second stage ST2 through the scan clock signal connection line 212 connected to the second stage ST2. The third scan clock signal line SC3 may be configured to transfer a third scan clock signal CLK_SC3 to the third stage ST3 through the scan clock signal connection line 212 connected to the third stage ST3. The fourth scan clock signal line SC4 may be configured to transfer a fourth scan clock signal CLK_SC4 to the fourth stage ST4 through the scan clock signal connection line 212 connected to the fourth stage ST4. The fifth scan clock signal line SC5 may be configured to transfer a fifth scan clock signal CLK_SC5 to the fifth stage ST5 through the scan clock signal connection line 212 connected to the fifth stage ST5. The sixth scan clock signal line SC6 may be configured to transfer a sixth scan clock signal CLK_SC6 to the sixth stage ST6 through the scan clock signal connection line 212 connected to the sixth stage ST6.

The first to sixth sensing clock signal lines SS1, SS2, SS3, SS4, SS5, and SS6 may be spaced apart from each other by a suitable distance (e.g., a predetermined or preset distance). The first sensing clock signal line SS1 may be electrically connected to a sensing clock signal connection line 213 extending in the first direction (e.g., the ±x direction). The sensing clock signal connection line 213 may be connected to the first stage ST1, and may be configured to transfer a first sensing clock signal CLK_SS1 from the first sensing clock signal line SS1 to the first stage ST1. The same or substantially the same description as that of the first sensing clock signal line SS1 above may be applied to the second to sixth sensing clock signal lines SS2, SS3, SS4, SS5, and SS6. As an example, as shown in FIG. 3, the second sensing clock signal line SS2 may be configured to transfer a second sensing clock signal CLK_SS2 to the second stage ST2 through the sensing clock signal connection line 213 connected to the second stage ST2. The third sensing clock signal line SS3 may be configured to transfer a third sensing clock signal CLK_SS3 to the third stage ST3 through the sensing clock signal connection line 213 connected to the third stage ST3. The fourth sensing clock signal line SS4 may be configured to transfer a fourth sensing clock signal CLK_SS4 to the fourth stage ST4 through the sensing clock signal connection line 213 connected to the fourth stage ST4. The fifth sensing clock signal line SS5 may be configured to transfer a fifth sensing clock signal CLK_SS5 to the fifth stage ST5 through the sensing clock signal connection line 213 connected to the fifth stage ST5. The sixth sensing clock signal line SS6 may be configured to transfer a sixth sensing clock signal CLK_SS6 to the sixth stage ST6 through the sensing clock signal connection line 213 connected to the sixth stage ST6.

The first to sixth global clock signal lines GB1, GB2, GB3, GB4, GB5, and GB6 may be spaced apart from each other by a suitable distance (e.g., a predetermined or preset distance). The first to sixth global clock signal lines GB1, GB2, GB3, GB4, GB5, and GB6 may be electrically connected to six global clock signal connection lines 214 extending in the first direction (e.g., the ±x direction), respectively, and may be configured to transfer first to sixth global clock signals CLK_GB1, CLK_GB2, CLK_GB3, CLK_GB4, CLK_GB5, and CLK_GB6 to the first stage ST1. The same or substantially the same description as that of the first stage ST1 above may be applied to the second to sixth stages ST2, ST3, ST4, ST5, and ST6.

Each of the first to sixth stages ST1, ST2, ST3, ST4, ST5, and ST6 of the gate driver 200 may be connected to the corresponding carry clock signal line CR, the corresponding scan clock signal line SC, the corresponding sensing clock signal line SS, and the corresponding six global clock signal lines GB1, GB2, GB3, GB4, GB5, and GB6. In other words, for example, nine clock signals may be applied to one stage. Each stage may be configured to output a scan signal (e.g., SCn in FIG. 2) and a sensing signal (e.g., SSn in FIG. 2) based on the nine clock signals.

As an example, a first carry clock signal CLK_CR1, a first scan clock signal CLK_SC1, a first sensing clock signal CLK_SS1, and first to sixth global clock signals CLK_GB1, CLK_GB2, CLK_GB3, CLK_GB4, CLK_GB5, and CLK_GB6 may be applied to the first stage ST1. The first stage ST1 may be configured to output a first scan signal SCn1 and a first sensing signal SSn1 based on at least one of the clock signals applied thereto. The first stage ST1 may be configured to output the first scan signal SCn1 based on the first scan clock signal CLK_SC1, and may output the first sensing signal SSn1 based on the first sensing clock signal CLK_SS1.

A second carry clock signal CLK_CR2, a second scan clock signal CLK_SC2, a second sensing clock signal CLK_SS2, and first to sixth global clock signals CLK_GB1, CLK_GB2, CLK_GB3, CLK_GB4, CLK_GB5, and CLK_GB6 may be applied to the second stage ST2. The second stage ST2 may be configured to output a second scan signal SCn2 and a second sensing signal SSn2 based on at least one of the clock signals applied thereto. The second stage ST2 may be configured to output the second scan signal SCn2 based on the second scan clock signal CLK_SC2, and may output the second sensing signal SSn2 based on the second sensing clock signal CLK_SS2.

A third carry clock signal CLK_CR3, a third scan clock signal CLK_SC3, a third sensing clock signal CLK_SS3, and first to sixth global clock signals CLK_GB1, CLK_GB2, CLK_GB3, CLK_GB4, CLK_GB5, and CLK_GB6 may be applied to the third stage ST3. The third stage ST3 may be configured to output a third scan signal SCn3 and a third sensing signal SSn3 based on at least one of the clock signals applied thereto. The third stage ST3 may be configured to output the third scan signal SCn3 based on the third scan clock signal CLK_SC3, and may output the third sensing signal SSn3 based on the third sensing clock signal CLK_SS3.

A fourth carry clock signal CLK_CR4, a fourth scan clock signal CLK_SC4, a fourth sensing clock signal CLK_SS4, and first to sixth global clock signals CLK_GB1, CLK_GB2, CLK_GB3, CLK_GB4, CLK_GB5, and CLK_GB6 may be applied to the fourth stage ST4. The fourth stage ST4 may be configured to output a fourth scan signal SCn4 and a fourth sensing signal SSn4 based on at least one of the clock signals applied thereto. The fourth stage ST4 may be configured to output the fourth scan signal SCn4 based on the fourth scan clock signal CLK_SC4, and may output the fourth sensing signal SSn4 based on the fourth sensing clock signal CLK_SS4.

A fifth carry clock signal CLK_CR5, a fifth scan clock signal CLK_SC5, a fifth sensing clock signal CLK_SS5, and first to sixth global clock signals CLK_GB1, CLK_GB2, CLK_GB3, CLK_GB4, CLK_GB5, and CLK_GB6 may be applied to the fifth stage ST5. The fifth stage ST5 may be configured to output a fifth scan signal SCn5 and a fifth sensing signal SSn5 based on at least one of the clock signals applied thereto. The fifth stage ST5 may be configured to output the fifth scan signal SCn5 based on the fifth scan clock signal CLK_SC5, and may output the fifth sensing signal SSn5 based on the fifth sensing clock signal CLK_SS5.

A sixth carry clock signal CLK_CR6, a sixth scan clock signal CLK_SC6, a sixth sensing clock signal CLK_SS6, and first to sixth global clock signals CLK_GB1, CLK_GB2, CLK_GB3, CLK_GB4, CLK_GB5, and CLK_GB6 may be applied to the sixth stage ST6. The sixth stage ST6 may be configured to output a sixth scan signal SCn6 and a sixth sensing signal SSn6 based on at least one of the clock signals applied thereto. The sixth stage ST6 may be configured to output the sixth scan signal SCn6 based on the sixth scan clock signal CLK_SC6, and may output the sixth sensing signal SSn6 based on the sixth sensing clock signal CLK_SS6.

Figure 4:
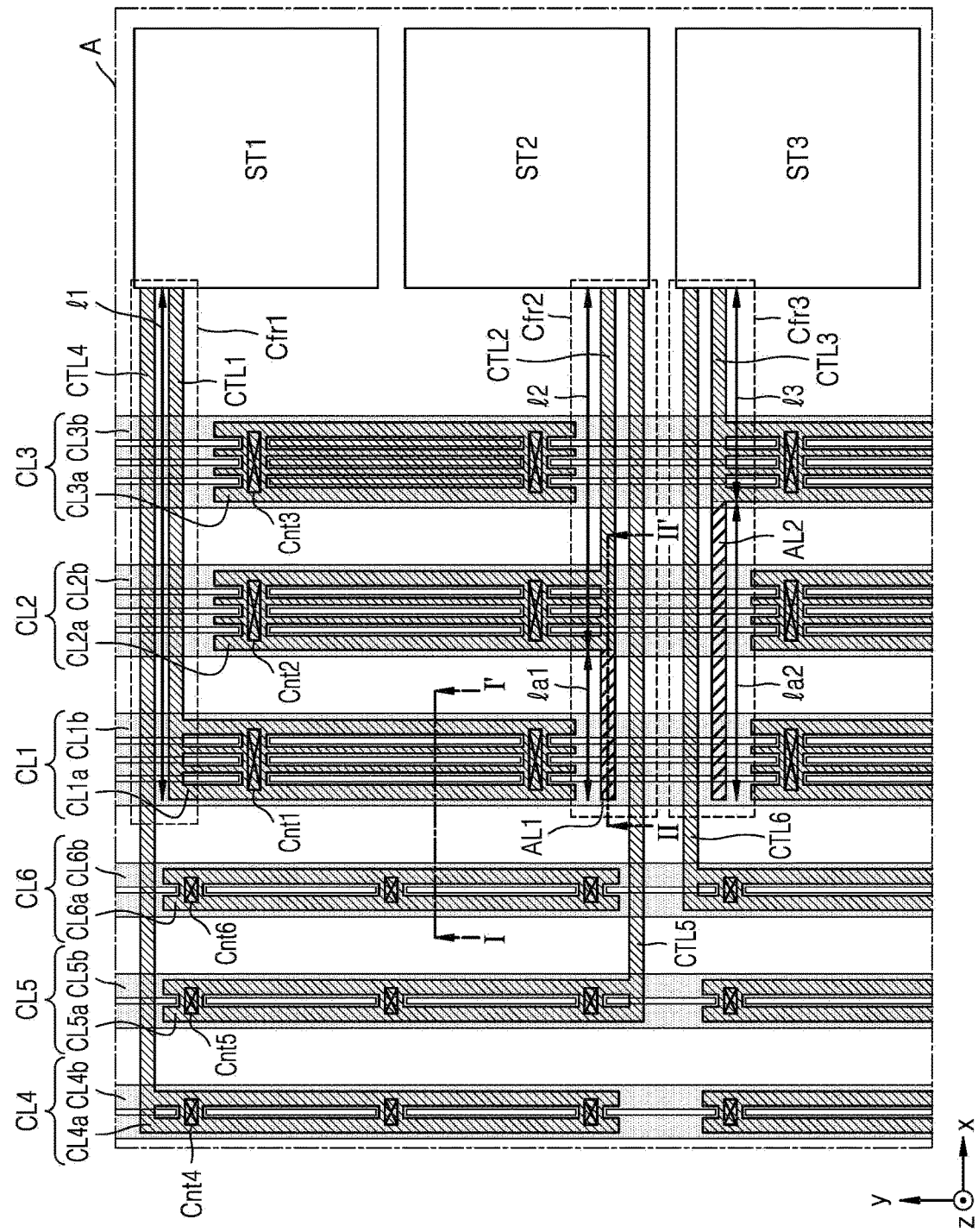
FIG. 4 is a schematic enlarged view of a portion of a display apparatus according to an embodiment.

FIG. 4 is a schematic enlarged view of a portion of the display apparatus 1 according to an embodiment.

Referring to FIG. 4, the display apparatus 1 (e.g., see FIG. 1) may include a plurality of conductive lines, a plurality of stages, a plurality of connection lines, and a plurality of auxiliary lines arranged at (e.g., in or on) one side of the peripheral area PA.

The plurality of conductive lines may be arranged along the first direction (e.g., the ±x direction), and may extend in the second direction (e.g., the ±y direction). The plurality of conductive lines may each include a lower conductive line, and an upper conductive line electrically connected to the lower conductive line. The lower conductive line may overlap with the upper conductive line. As an example, a first conductive line CL1 may include a first lower conductive line CL1a and a first upper conductive line CL1b. The first lower conductive line CL1a may be connected to the first upper conductive line CL1b through a first contact hole Cnt1. A second conductive line CL2 may include a second lower conductive line CL2a and a second upper conductive line CL2b. The second lower conductive line CL2a may be connected to the second upper conductive line CL2b through a second contact hole Cnt1. A third conductive line CL3 may include a third lower conductive line CL3a and a third upper conductive line CL3b. The third lower conductive line CL3a may be connected to the third upper conductive line CL3b through a third contact hole Cnt3. A fourth conductive line CL4 may include a fourth lower conductive line CL4a and a fourth upper conductive line CL4b. The fourth lower conductive line CL4a may be connected to the fourth upper conductive line CL4b through a fourth contact hole Cnt4. A fifth conductive line CL5 may include a fifth lower conductive line CL5a and a fifth upper conductive line CL5b. The fifth lower conductive line CL5a may be connected to the fifth upper conductive line CL5b through a fifth contact hole Cnt5. A sixth conductive line CL6 may include a sixth lower conductive line CL6a and a sixth upper conductive line CL6b. The sixth lower conductive line CL6a may be connected to the sixth upper conductive line CL6b through a sixth contact hole Cnt6.

The lower conductive line of each of the plurality of conductive lines, may be provided in a plurality. The plurality of lower conductive lines may be spaced apart from each other in the second direction (e.g., the ±y direction), and may overlap with the upper conductive line. As an example, the first lower conductive line CL1a of the first conductive line CL1 may be provided in a plurality. The plurality of first lower conductive lines CL1a may be spaced apart from each other in the second direction (e.g., the ±y direction), and may overlap with the first upper conductive line CL1b. The second lower conductive line CL2a of the second conductive line CL2 may be provided in a plurality. The plurality of second lower conductive lines CL2a may be spaced apart from each other in the second direction (e.g., the ±y direction), and may overlap with the second upper conductive line CL2b. The third lower conductive line CL3a of the third conductive line CL3 may be provided in a plurality. The plurality of third lower conductive lines CL3a may be spaced apart from each other in the second direction (e.g., the ±y direction), and may overlap with the third upper conductive line CL3b. The fourth lower conductive line CL4a of the fourth conductive line CL4 may be provided in a plurality. The plurality of fourth lower conductive lines CL4a may be spaced apart from each other in the second direction (e.g., the ±y direction), and may overlap with the fourth upper conductive line CL4b. The fifth lower conductive line CL5a of the fifth conductive line CL5 may be provided in a plurality. The plurality of fifth lower conductive lines CL5a may be spaced apart from each other in the second direction (e.g., the ±y direction), and may overlap with the fifth upper conductive line CL5b. The sixth lower conductive line CL6a of the sixth conductive line CL6 may be provided in a plurality. The plurality of sixth lower conductive lines CL6a may be spaced apart from each other in the second direction (e.g., the ±y direction), and may overlap with the sixth upper conductive line CL6b.

The plurality of stages may be arranged along the second direction (e.g., the ±y direction). A plurality of connection lines may extend in the first direction (e.g., the ±x direction), and may connect the plurality of conductive lines to the plurality of stages. As an example, the first connection line CTL1 may extend in the first direction (e.g., the ±x direction), and may connect the first conductive lines CL1 to the first stage ST1. The second connection line CTL2 may extend in the first direction (e.g., the ±x direction), and may connect the second conductive lines CL2 to the second stage ST2. The third connection line CTL3 may extend in the first direction (e.g., the ±x direction), and may connect the third conductive lines CL3 to the third stage ST3. The fourth connection line CTL4 may extend in the first direction (e.g., the ±x direction), and may connect the fourth conductive lines CL4 to the first stage ST1. The fifth connection line CTL5 may extend in the first direction (e.g., the ±x direction), and may connect the fifth conductive lines CL5 to the second stage ST2. The sixth connection line CTL6 may extend in the first direction (e.g., the ±x direction), and may connect the sixth conductive lines CL6 to the third stage ST3.

The plurality of conductive lines may correspond to the clock signal lines of FIG. 3. As an example, the first conductive line CL1, the second conductive line CL2, and the third conductive line CL3 may correspond to the scan clock signal lines SC or the sensing clock signal lines SS of FIG. 3, and the fourth conductive line CL4, the fifth conductive line CL5, and the sixth conductive line CL6 may correspond to the carry clock signal lines CR of FIG. 3. The first conductive line CL1, the second conductive line CL2, and the third conductive line CL3 may be configured to transfer scan clock signals CLK_SC or sensing clock signals CLK_SS of FIG. 3 to the first stage ST1, the second stage ST2, and the third stage ST3, respectively, through the first connection line CTL1, the second connection line CTL2, and the third connection line CTL3. The fourth conductive line CL4, the fifth conductive line CL5, and the sixth conductive line CL6 may be configured to transfer carry clock signals CLK_CR of FIG. 3 to the first stage ST1, the second stage ST2, and the third stage ST3, respectively, through the fourth connection line CTL4, the fifth connection line CTL5, and the sixth connection line CTL6. The first stage ST1, the second stage ST2, and the third stage ST3 may each be configured to output scan signals (e.g., see SCn in FIG. 2) or sensing signals (e.g., see SSn in FIG. 2), based on the scan clock signals CLK_SC or the sensing clock signals CLK_SS.

In an embodiment, the connection line may be one body with one of the lower conductive lines of the conductive line. The connection line may be integrally connected to one of the lower conductive lines of the conductive line. As an example, the first connection line CTL1 may be integrally connected to one of the first lower conductive lines CL1a of the first conductive line CL1. The second connection line CTL2 may be integrally connected to one of the second lower conductive lines CL2a of the second conductive line CL2. The third connection line CTL3 may be integrally connected to one of the third lower conductive lines CL3a of the third conductive line CL3. The fourth connection line CTL4 may be integrally connected to one of the fourth lower conductive lines CL4a of the fourth conductive line CL4. The fifth connection line CTL5 may be integrally connected to one of the fifth lower conductive lines CL5a of the fifth conductive line CL5. The sixth connection line CTL6 may be integrally connected to one of the sixth lower conductive lines CL6a of the sixth conductive line CL6.

In an embodiment, the lower conductive lines integrally connected to the connection lines may be located at (e.g., in or on) the same row as each other. As another example, the lower conductive lines integrally connected to the connection lines may be located at (e.g., in or on) different rows from one another. As an example, the first lower conductive line CL1a of the first conductive line CL1 integrally connected to the first connection line CTL1, and the second lower conductive line CL2a of the second conductive line CL2 integrally connected to the second connection line CTL2 may be located at (e.g., in or on) the same row as each other. The first lower conductive line CL1a of the first conductive line CL1 integrally connected to the first connection line CTL1 may be adjacent to the second lower conductive line CL2a of the second conductive line CL2 integrally connected to the second connection line CTL2. The first lower conductive line CL1a of the first conductive line CL1 integrally connected to the first connection line CTL1, and the third lower conductive line CL3a of the third conductive line CL3 integrally connected to the third connection line CTL3 may be located at (e.g., in or on) different rows from each other. The second lower conductive line CL2a of the second conductive line CL2 integrally connected to the second connection line CTL2, and the third lower conductive line CL3a of the third conductive line CL3 integrally connected to the third connection line CTL3 may be located at (e.g., in or on) different rows from each other. The fourth lower conductive line CL4a of the fourth conductive line CL4 integrally connected to the fourth connection line CTL4, and the fifth lower conductive line CL5a of the fifth conductive line CL5 integrally connected to the fifth connection line CTL5 may be located at (e.g., in or on) the same row as each other. The fourth lower conductive line CL4a of the fourth conductive line CL4 integrally connected to the fourth connection line CTL4 may be adjacent to the fifth lower conductive line CL5a of the fifth conductive line CL5 integrally connected to the fifth connection line CTL5. The fourth lower conductive line CL4a of the fourth conductive line CL4 integrally connected to the fourth connection line CTL4, and the sixth lower conductive line CL6a of the sixth conductive line CL6 integrally connected to the sixth connection line CTL6 may be located at (e.g., in or on) different rows from each other. The fourth lower conductive line CL4a of the fourth conductive line CL4 integrally connected to the fourth connection line CTL4, and the sixth lower conductive line CL6a of the sixth conductive line CL6 integrally connected to the sixth connection line CTL6 may be located at (e.g., in or on) different rows from each other.

In an embodiment, the plurality of connection lines in the first direction (e.g., the ±x direction) may be different from one another. As an example, a first length l1 of the first connection line CTL1 in the first direction (e.g., the ±x direction) may be greater than a second length l2 of the second connection line CTL2 in the first direction (e.g., the ±x direction). The second length l2 of the second connection line CTL2 may be greater than a third length l3 of the third connection line CTL3 in the first direction (e.g., the ±x direction). A length of the fourth connection line CTL4 in the first direction (e.g., the ±x direction) may be greater than a length of the fifth connection line CTL5 in the first direction (e.g., the ±x direction). The length of the fifth connection line CTL5 in the first direction (e.g., the ±x direction) may be greater than a length of the sixth connection line CTL6 in the first direction (e.g., the ±x direction).

A plurality of auxiliary lines may extend in the first direction (e.g., the ±x direction) from the first conductive line CL1, and may be respectively connected to some of the connection lines. As an example, a first auxiliary line AL1 may extend in the first direction (e.g., the ±x direction) from the first conductive line CL1, and may be connected to the second connection line CTL2. A second auxiliary line AL2 may extend in the first direction (e.g., the ±x direction) from the first conductive line CL1, and may be connected to the third connection line CTL3. The first auxiliary line AL1 may be integrally connected to the second connection line CTL2. The second auxiliary line AL2 may be integrally connected to the third connection line CTL3.

In an embodiment, the plurality of auxiliary lines in the first direction (e.g., the ±x direction) may be different from one another. As an example, a first auxiliary length la1 of the first auxiliary line AL1 in the first direction (e.g., the ±x direction), may be less than a second auxiliary length la2 of the second auxiliary line AL2 in the first direction (e.g., the ±x direction).

In an embodiment, a sum of the length of the connection line and the length of the auxiliary line in the first direction (e.g., the ±x direction) may be constant or substantially constant. As an example, the first length l1 of the first connection line CTL1 may be the same or substantially the same as a sum (e.g., l2+la1) of the second length l2 of the second connection line CTL2 and the first auxiliary length la1 of the first auxiliary line AL1. The first length l1 of the first connection line CTL1 may be the same or substantially the same as a sum (e.g., l3+la2) of the third length l3 of the third connection line CTL3 and the second auxiliary length la2 of the second auxiliary line AL2. A sum (e.g., l2+la1) of the second length l2 of the second connection line CTL2 and the first auxiliary length la1 of the first auxiliary line AL1 may be the same or substantially the same as a sum (e.g., l3+la2) of the third length l3 of the third connection line CTL3 and the second auxiliary length la2 of the second auxiliary line AL2.

In an embodiment, a fringe capacitance value formed by the connection lines and the auxiliary line may be constant or substantially constant. As an example, a first fringe capacitance value Cfr1 formed between the first connection line CTL1 and the fourth connection line CTL4 may be the same or substantially the same as a second fringe capacitance value Cfr2 formed between the second connection line CTL2 and the first auxiliary line AL1, and the fifth connection line CTL5. The first fringe capacitance value Cfr1 formed between the first connection line CTL1 and the fourth connection line CTL4 may be the same or substantially the same as a third fringe capacitance value Cfr3 formed between the third connection line CTL3 and the second auxiliary line AL2, and the sixth connection line CTL6. The second fringe capacitance value Cfr2 formed between the second connection line CTL2 and the first auxiliary line AL1, and the fifth connection line CTL5, may be the same or substantially the same as the third fringe capacitance value Cfr3 formed between the third connection line CTL3 and the second auxiliary line AL2, and the sixth connection line CTL6.

As a comparative example, the auxiliary lines may not be arranged at (e.g., in or on) the peripheral area. In this case, a fringe capacitance value formed between the connection lines may not be constant. The lengths of the connection lines in the first direction (e.g., the ±x direction) may be different from each other, and a fringe capacitance value formed between the connection lines may not be constant due to the different values (e.g., the different lengths). As an example, a fringe capacitance value formed between the first connection line CTL1 and the fourth connection line CTL4 becomes greater than a fringe capacitance value formed between the third connection line CTL3 and the sixth connection line CTL6. Thus, due to different fringe capacitance values between the connection lines and signal delay differences caused by the different fringe capacitance values, smudge defects in the horizontal lines may occur.

In comparison, the display apparatus 1 according to one or more embodiments may include the auxiliary lines respectively connected to the connection lines. In this case, as described above, because a fringe capacitance value formed by the connection lines and the auxiliary line may be constant or substantially constant, a deviation in a signal delay applied to the display area may be reduced, and smudge defects in the horizontal lines due to the signal delay may be prevented or substantially prevented.

Figure 5:
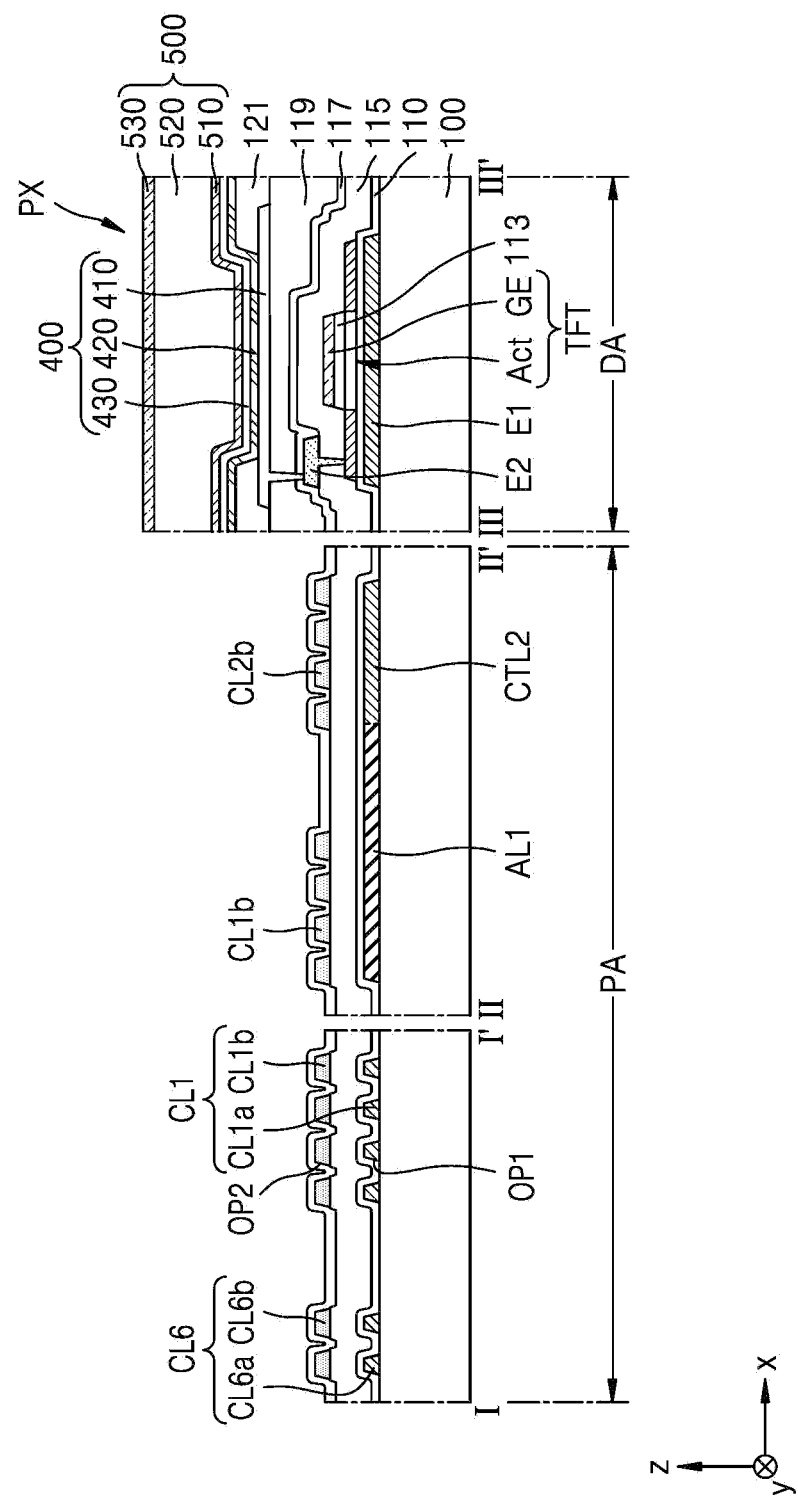
FIG. 5 is a cross-sectional view of an example of conductive lines, an auxiliary line, a connection line, and a pixel taken along the lines I-I' and II-II' of FIG. 4 and along the line III-III' of FIG. 1.

FIG. 5 is a cross-sectional view of an example of conductive lines, an auxiliary line, a connection line, and a pixel taken along the lines I-I' and II-II' of FIG. 4 and along the line III-III' of FIG. 1.

Referring to FIG. 5, the display apparatus 1 (e.g., see FIG. 1) may include the conductive lines, the connection line, and the auxiliary line arranged at (e.g., in or on) the peripheral area PA, and the pixel PX arranged at (e.g., in or on) the display area DA.

As described above with reference to FIG. 4, the conductive lines may each include the lower conductive line, and the upper conductive line electrically connected to the lower conductive line. The lower conductive line may overlap with the upper conductive line. As an example, the first conductive line CL1 may include a first lower conductive line CL1a and a first upper conductive line CL1b overlapping with each other. The sixth conductive line CL6 may include a sixth lower conductive line CL6a and a sixth upper conductive line CL6b overlapping with each other.

The connection line and the auxiliary line may at least partially overlap with the upper conductive lines. As an example, as shown in FIG. 5, the first auxiliary line AL1 may at least partially overlap with the first upper conductive line CL1b of the first conductive line CL1. The second connection line CTL2 may at least partially overlap with the second upper conductive line CL2b of the second conductive line CL2.

The pixel PX may include a thin-film transistor TFT, and a light-emitting element 400 electrically connected to the thin-film transistor TFT. The thin-film transistor TFT may include a gate electrode GE and a semiconductor layer Act. The light-emitting element 400 may include a pixel electrode 410, an emission layer 420, and an opposite electrode 430.

Hereinafter, the configuration included in the display apparatus 1 is described in more detail according to a stacked structure with reference to FIG. 5. While FIG. 5 illustrates some members, for example, such as the first conductive line CL1, the sixth conductive line CL6, the first auxiliary line AL1, and the second connection line CTL2, the conductive lines, the connection lines, and the auxiliary lines of FIG. 4 may have the same or substantially the same structure and/or configuration as those shown in FIG. 5, and thus, redundant description thereof may not be repeated.

The substrate 100 may include a glass material, a ceramic material, a metal, or a flexible or bendable material. The substrate 100 may have a single-layer structure or a multi-layered structure, and may further include an inorganic layer in the case of the multi-layered structure. In an embodiment, the substrate 100 may have a structure (e.g., a stacked structure) of an organic material/an inorganic material/an organic material.

A buffer layer 110 may be on the substrate 100 to provide a flat or substantially flat surface on the substrate 100, and may reduce or block penetration of foreign materials, moisture, and/or external air from below the substrate 100. The buffer layer 110 may include an inorganic material, an organic material, or an organic/inorganic composite material, and may have a single layer or a multi-layered structure including an inorganic material and an organic material. In this case, the inorganic material may include an oxide or a nitride.

The semiconductor layer Act may be disposed on the buffer layer 110. The semiconductor layer Act may include an oxide semiconductor material. The semiconductor layer Act may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn).

As an example, the semiconductor layer Act may be an ITZO(InSnZnO) semiconductor layer, an IGZO(InGaZnO) semiconductor layer, and/or the like. Because an oxide semiconductor has a wide band gap (e.g., of about 3.1 eV), high carrier mobility, and low leakage current, a voltage drop may not be large even though a driving time is long. Thus, in the case of the oxide semiconductor, a brightness change due to a voltage drop may not be large, even when the display apparatus is driven at low frequencies.

The semiconductor layer Act may include a channel region, a drain region, and a source region. The drain region and the source region may be on (e.g., may extend from) two opposite sides of the channel region. The semiconductor layer Act may include a single layer or multi-layers.

The first lower conductive line CL1a, the sixth lower conductive line CL6a, the first auxiliary line AL1, the second connection line CTL2, and a first electrode E1 may be disposed between the substrate 100 and the buffer layer 110. The first lower conductive line CL1a and the sixth lower conductive line CL6a may each include a plurality of first openings (or holes) OP1 that expose at least a portion of the substrate 100. The first electrode E1 may be arranged to overlap with the channel region of the semiconductor layer Act. The first lower conductive line CL1a, the sixth lower conductive line CL6a, the first auxiliary line AL1, the second connection line CTL2, and the first electrode E1 may each include a conductive material including molybdenum (Mo), aluminum (Al), copper (Cu), titanium (Ti), and/or the like, and have a multi-layered structure or a single layer including one or more of the above materials. As an example, the first lower conductive line CL1a, the sixth lower conductive line CL6a, the first auxiliary line AL1, the second connection line CTL2, and the first electrode E1 may have a multi-layered structure of Ti/Al/Ti.

The first electrode E1 may be arranged to overlap with the semiconductor layer Act including an oxide semiconductor material. Because the semiconductor layer Act including the oxide semiconductor material may be vulnerable to light, the first electrode E1 may prevent or substantially prevent a change in device characteristics of the thin film transistor TFT including the oxide semiconductor material due to a photocurrent induced in the semiconductor layer Act by external light incident from outside of (e.g., from the side of) the substrate 100.

A gate insulating layer 113 may be disposed on the semiconductor layer Act. The gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

As shown in FIG. 5, the gate insulating layer 113 may be patterned to overlap with a portion of the semiconductor layer Act. In other words, the gate insulating layer 113 may be patterned to expose the source region and the drain region.

A region of the semiconductor layer Act that overlaps with the gate insulating layer 113 may be understood to be the channel region. The source region and the drain region may be provided through a process of making a conductor by a plasma treatment. In this case, because the portion (e.g., the channel region) of the gate insulating layer 113 that overlaps with the semiconductor layer Act is not exposed to the plasma treatment, the channel region has different properties from those of the source region and the drain region. In other words, while plasma treatment is performed on the semiconductor layer Act, the channel region that is not plasma-treated is formed in a position of the semiconductor layer Act overlapping with the gate insulating layer 113 by using the gate electrode GE located on the gate insulating layer 113 as a self-align mask, and the source region and the drain region that are plasma-treated, respectively, may be formed at (e.g., in or on) two opposite sides of the channel region.

In another embodiment, the gate insulating layer 113 may not be patterned to overlap with a portion of the semiconductor layer Act, and may be disposed on an entire or substantially entire surface of the substrate 100 to cover the semiconductor layer Act.

The gate electrode GE may be arranged on the gate insulating layer 113 to overlap with at least a portion of the semiconductor layer Act. The gate electrode GE may include at least one metal from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu), and may have a single layer or multi-layers including one or more of the above materials.

An interlayer insulating layer 115 may be provided to cover the semiconductor layer Act and the gate electrode GE. The interlayer insulating layer 115 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first upper conductive line CL1b, the second upper conductive line CL2b, the sixth upper conductive line CL6b, and a second electrode E2 may be disposed on the interlayer insulating layer 115. The first upper conductive line CL1b, the second upper conductive line CL2b, and the sixth upper conductive line CL6b may each include a plurality of second openings OP2 (e.g., holes) that expose at least a portion of the interlayer insulating layer 115. The first upper conductive line CL1b, the second upper conductive line CL2b, and the sixth upper conductive line CL6b may each include the plurality of second openings OP2 (e.g., holes) that correspond to (e.g., that overlap with) the plurality of first openings OP1, respectively. The first upper conductive line CL1b, the second upper conductive line CL2b, the sixth upper conductive line CL6b, and the second electrode E2 may each include a conductive material including molybdenum (Mo), aluminum (Al), copper (Cu), titanium (Ti), and/or the like, and may have a multi-layered structure or a single layer including one or more of the above materials. As an example, the first upper conductive line CL1b, the second upper conductive line CL2b, the sixth upper conductive line CL6b, and the second electrode E2 may each have a multi-layered structure of Ti/Al/Ti.

The first upper conductive line CL1b may be connected to the first lower conductive line CL1a through the first contact hole Cnt1 (e.g., see FIG. 4), and the sixth upper conductive line CL6b may be connected to the sixth lower conductive line CL6a through the sixth contact hole Cnt6. The first contact hole Cnt1 and the sixth contact hole Cnt6 may each be formed in (e.g., penetrate) the buffer layer 110 and the interlayer insulating layer 115.

The second electrode E2 may be connected to the source region or the drain region of the semiconductor layer Act through a contact hole formed in (e.g., penetrating) the interlayer insulating layer 115.

The first upper conductive line CL1b, the second upper conductive line CL2b, the sixth upper conductive line CL6b, and the second electrode E2 may each be covered by a passivation layer 117. The passivation layer 117 may be an inorganic insulating layer including an inorganic material.

For the inorganic material, polysiloxane, silicon nitride, silicon oxide, silicon oxynitride, or the like may be used. In addition, the passivation layer 117 may include a single layer or multi-layers including one or more of the above-mentioned materials. As an example, the passivation layer 117 may include a single layer or multi-layers including silicon nitride ($SiN_x$) and silicon oxide ($SiO_x$). The passivation layer 117 may cover and protect some wirings disposed on the interlayer insulating layer 115.

A planarization layer 119 may be disposed on the passivation layer 117. The planarization layer 119 may include a contact hole for connecting the thin-film transistor TFT to the pixel electrode 410.

The planarization layer 119 may include a single layer or multi-layers including an organic material, and may provide a flat or substantially flat upper surface. The planarization layer 119 may include a general-purpose polymer, such as benzocyclobutene (BCB), polyimide, hexamethyldisiloxane (HMDSO), polymethylmethacrylate (PMMA), or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a suitable blend thereof.

The light-emitting element 400 may be disposed on the planarization layer 119, and the light-emitting element 400 may include the pixel electrode 410, the emission layer 420, and the opposite electrode 430.

The pixel electrode 410 may be a (semi) light-transmissive electrode or a reflective electrode. In an embodiment, the pixel electrode 410 may include a reflective layer, and a transparent or semi-transparent electrode layer on the reflective layer. The reflective layer may include at least one of Ag, Mg, Al, Pt, Pd, Au, Ni, Nd, Ir, Cr, or a suitable compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 410 may include a triple layer. As an example, the triple layer of the pixel electrode 410 may include ITO/Ag/ITO.

A pixel-defining layer 121 may be disposed on the planarization layer 119. The pixel-defining layer 121 may cover edges of the pixel electrode 410, and may have an opening that exposes a portion of the pixel electrode 410. The pixel-defining layer 121 may prevent or substantially prevent arcs and the like from occurring at the edges of each pixel electrode 410, by increasing a distance between the edges of the pixel electrode 410 and the opposite electrode 430 over the pixel electrode 410. The pixel-defining layer 121 may include an organic insulating material, such as polyimide, an acrylic resin, benzocyclobutene, a phenolic resin, and/or the like, and be formed by using spin coating and/or the like.

The emission layer 420 may be disposed on the pixel electrode 410 and the pixel-defining layer 121, and may include an organic emission layer. The organic emission layer may include an organic material including a fluorescent or phosphorous material for emitting red, green, blue, or white light. The organic emission layer may include a polymer organic material or a low molecular weight organic material. Functional layers may be selectively further arranged under and/or over the organic emission layer. The functional layers may include a hole transport layer (HTL), a hole injection layer (HIL), an electron transport layer (ETL), and/or an electron injection layer (EIL).

The opposite electrode 430 may be a light-transmissive electrode or a reflective electrode. In an embodiment, the opposite electrode 430 may be a transparent or semi-transparent electrode, and may include a metal thin film including Li, Ca, LiF/Ca, LiF/Al, Al, Ag, Mg, or a suitable compound thereof, and having a small work function. In addition, a transparent conductive oxide (TCO) layer, such as ITO, IZO, ZnO, or $In_2O_3$, may be further arranged on the metal thin film. The opposite electrode 430 may be arranged over the display area DA, and may be disposed on the emission layer 420 and the pixel-defining layer 121. The opposite electrode 430 may be formed as one body over the plurality of light-emitting elements 400 to correspond to the plurality of pixel electrodes 410.

Because the light-emitting element 400 including an organic emission layer may be easily damaged by external moisture, oxygen, and/or the like, an encapsulation layer 500 may cover and protect the light-emitting element 400. The encapsulation layer 500 may be disposed on the opposite electrode 430, may cover the display area DA, and may extend to at least a portion of the peripheral area PA. The encapsulation layer 500 includes a first inorganic encapsulation layer 510, an organic encapsulation layer 520, and a second inorganic encapsulation layer 530. The first inorganic encapsulation layer 510 and the second inorganic encapsulation layer 530 may include at least one inorganic material from among aluminum oxide, titanium oxide, tantalum oxide, hafnium oxide, zinc oxide, silicon oxide, silicon nitride, and silicon oxynitride. The organic encapsulation layer 520 may include a polymer-based material. The polymer-based material may include an acryl-based resin, an epoxy-based resin, polyimide, and/or polyethylene. In an embodiment, the organic encapsulation layer 520 may include acrylate.

Figure 6:
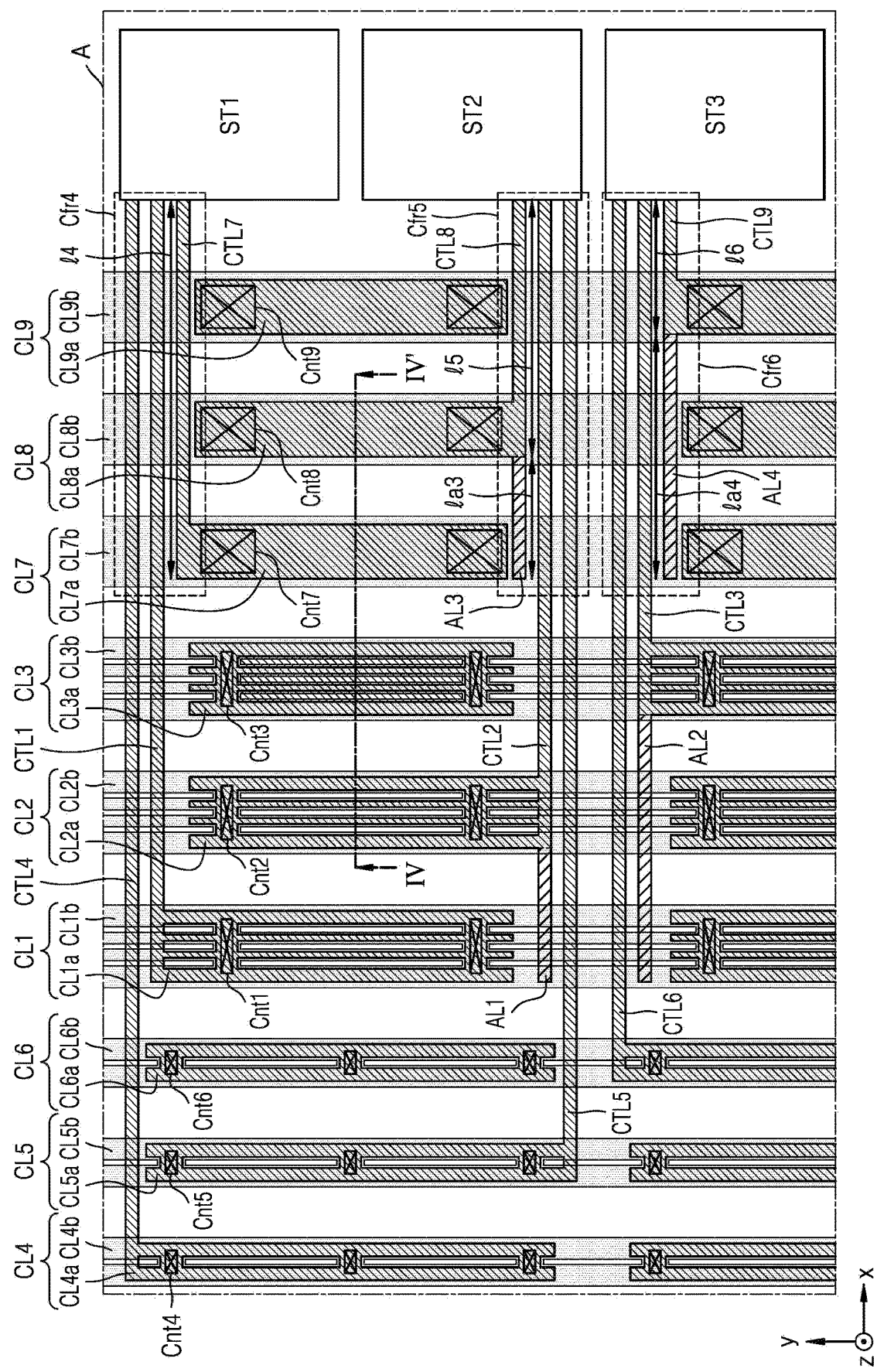
FIG. 6 is a schematic enlarged view of a portion of a display apparatus according to an embodiment.

FIG. 6 is a schematic enlarged view of a portion of the display apparatus 1 according to an embodiment. The embodiment illustrated in FIG. 6 may be different from that of FIG. 4, in that the structures of the conductive lines, the connection lines, and the auxiliary lines may be different. Accordingly, redundant description with those above with reference to FIG. 4 may not be repeated, and the differences between the embodiments may be mainly described in more detail hereinafter.

Referring to FIG. 6, the plurality of conductive lines may be arranged along the first direction (e.g., the ±x direction), and may extend in the second direction (e.g., the ±y direction). The plurality of conductive lines may each include a lower conductive line, and an upper conductive line electrically connected to the lower conductive line. The lower conductive line may overlap with the upper conductive line. As an example, a seventh conductive line CL7 may include a seventh lower conductive line CL7a and a seventh upper conductive line CL7b. The seventh lower conductive line CL7a may be connected to the seventh upper conductive line CL7b through a seventh contact hole Cnt7. An eighth conductive line CL8 may include an eighth lower conductive line CL8a and an eighth upper conductive line CL8b. The eighth lower conductive line CL8a may be connected to the eighth upper conductive line CL8b through an eighth contact hole Cnt8. A ninth conductive line CL9 may include a ninth lower conductive line CL9a and a ninth upper conductive line CL9b. The ninth lower conductive line CL9a may be connected to the ninth upper conductive line CL9b through a ninth contact hole Cnt9.

A lower conductive line of each of the plurality of conductive lines may be provided in a plurality. The plurality of lower conductive lines may be spaced apart from each other in the second direction (e.g., the ±y direction), and may overlap with the upper conductive line. As an example, the seventh lower conductive line CL7a of the seventh conductive line CL7 may be provided in a plurality. The plurality of seventh lower conductive lines CL7a may be spaced apart from each other in the second direction (e.g., the ±y direction), and may overlap with the seventh upper conductive line CL7b. The eighth lower conductive line CL8a of the eighth conductive line CL8 may be provided in a plurality. The plurality of eighth lower conductive lines CL8a may be spaced apart from each other in the second direction (e.g., the ±y direction), and may overlap with the eighth upper conductive line CL8b. The ninth lower conductive line CL9a of the ninth conductive line CL9 may be provided in a plurality. The plurality of ninth lower conductive lines CL9a may be spaced apart from each other in the second direction (e.g., the ±y direction), and may overlap with the ninth upper conductive line CL9b.

The plurality of stages may be arranged along the second direction (e.g., the ±y direction). A plurality of connection lines may extend in the first direction (e.g., the ±x direction), and may connect the plurality of conductive lines to the plurality of stages. As an example, the seventh connection line CTL7 may extend in the first direction (e.g., the ±x direction), and may connect the seventh conductive lines CL7 to the first stage ST1. The eighth connection line CTL8 may extend in the first direction (e.g., the ±x direction), and may connect the eighth conductive lines CL8 to the second stage ST2. The ninth connection line CTL9 may extend in the first direction (e.g., the ±x direction), and may connect the ninth conductive lines CL9 to the third stage ST3.

The plurality of conductive lines may correspond to clock signal lines of FIG. 3. As an example, the first conductive line CL1, the second conductive line CL2, and the third conductive line CL3 may correspond to one of the scan clock signal lines SC and the sensing clock signal lines SS of FIG. 3, and the seventh conductive line CL7, the eighth conductive line CL8, and the ninth conductive line CL9 may correspond to others of the scan clock signal lines SC or the second clock signal lines SS of FIG. 3. The first conductive line CL1, the second conductive line CL2, and the third conductive line CL3 may be configured to transfer one of scan clock signals CLK_SC and sensing clock signals CLK_SS of FIG. 3 to the first stage ST1, the second stage ST2, and the third stage ST3, respectively, through the first connection line CTL1, the second connection line CTL2, and the third connection line CTL3. The seventh conductive line CL7, the eighth conductive line CL8, and the ninth conductive line CL9 may be configured to transfer others of scan clock signals CLK_SC and sensing clock signals CLK_SS of FIG. 3 to the first stage ST1, the second stage ST2, and the third stage ST3, respectively, through the seventh connection line CTL7, the eighth connection line CTL8, and the ninth connection line CTL9. The first stage ST1, the second stage ST2, and the third stage ST3 may be configured to output scan signals (e.g., see SCn in FIG. 2) based on the scan clock signals CLK_SC, and may output sensing signals (e.g., see SSn in FIG. 2) based on the sensing clock signals CLK_SS.

In an embodiment, the connection line may be one body with one of the lower conductive lines of the conductive line. The connection line may be integrally connected to one of the lower conductive lines of the conductive line. As an example, the seventh connection line CTL7 may be integrally connected to one of the seventh lower conductive lines CL7a of the seventh conductive line CL7. The eighth connection line CTL8 may be integrally connected to one of the eighth lower conductive lines CL8a of the eighth conductive line CL8. The ninth connection line CTL9 may be integrally connected to one of the ninth lower conductive lines CL9a of the ninth conductive line CL9.

In an embodiment, the lower conductive lines integrally connected to the connection lines may be located at (e.g., in or on) the same row as each other. As another example, the lower conductive lines integrally connected to the connection lines may be located at (e.g., in or on) different rows from each other. As an example, the seventh lower conductive line CL7a of the seventh conductive line CL7 integrally connected to the seventh connection line CTL7, and the eighth lower conductive line CL8a of the eighth conductive line CL8 integrally connected to the eighth connection line CTL8 may be located at (e.g., in or on) the same row as each other. The seventh lower conductive line CL7a of the seventh conductive line CL7 integrally connected to the seventh connection line CTL7, and the ninth lower conductive line CL9a of the ninth conductive line CL9 integrally connected to the ninth connection line CTL9 may be located at (e.g., in or on) different rows from each other. The eighth lower conductive line CL8a of the eighth conductive line CL8 integrally connected to the eighth connection line CTL8, and the ninth lower conductive line CL9a of the ninth conductive line CL9 integrally connected to the ninth connection line CTL9 may be located at (e.g., in or on) different rows from each other.

In an embodiment, the plurality of connection lines in the first direction (e.g., the ±x direction) may be different from one another. As an example, a fourth length l4 of the seventh connection line CTL7 in the first direction (e.g., the ±x direction) may be greater than a fifth length l5 of the eighth connection line CTL8 in the first direction (e.g., the ±x direction). The fifth length l5 of the eighth connection line CTL8 may be greater than a sixth length l6 of the ninth connection line CTL9 in the first direction (e.g., the ±x direction).

A plurality of auxiliary lines may extend in the first direction (e.g., the ±x direction) from the first conductive line CL1 or the seventh conductive line CL7, and be connected to some of the connection lines. As an example, a first auxiliary line AL1 may extend in the first direction (e.g., the ±x direction) from the first conductive line CL1, and may be connected to the second connection line CTL2. A second auxiliary line AL2 may extend in the first direction (e.g., the ±x direction) from the first conductive line CL1, and may be connected to the third connection line CTL3. The first auxiliary line AL1 may be integrally connected to the second connection line CTL2. The second auxiliary line AL2 may be integrally connected to the third connection line CTL3. A third auxiliary line AL3 may extend in the first direction (e.g., the ±x direction) from the seventh conductive line CL7, and may be connected to the eighth connection line CTL8. A fourth auxiliary line AL4 may extend in the first direction (e.g., the ±x direction) from the seventh conductive line CL7, and may be connected to the ninth connection line CTL9. The third auxiliary line AL3 may be integrally connected to the eighth connection line CTL8. The fourth auxiliary line AL4 may be integrally connected to the ninth connection line CTL9.

In an embodiment, the plurality of auxiliary lines in the first direction (e.g., the ±x direction) may be different from one another. As an example, a third auxiliary length la3 of the third auxiliary line AL3 in the first direction (e.g., the ±x direction) may be less than a fourth auxiliary length la4 of the fourth auxiliary line AL4 in the first direction (e.g., the ±x direction).

In an embodiment, a sum of the length of the connection line and the length of the auxiliary line in the first direction (e.g., the ±x direction) may be constant or substantially constant. As an example, the fourth length l4 of the seventh connection line CTL7 may be the same or substantially the same as a sum (e.g., l5+la3) of the fifth length l5 of the eighth connection line CTL8 and the third auxiliary length la3 of the third auxiliary line AL3. The fourth length l4 of the seventh connection line CTL7 may be the same or substantially the same as a sum (e.g., l6+la4) of the sixth length l6 of the ninth connection line CTL9 and the fourth auxiliary length la4 of the fourth auxiliary line AL4. A sum (e.g., l5+la3) of the fifth length l5 of the eighth connection line CTL8 and the third auxiliary length la3 of the third auxiliary line AL3 may be the same or substantially the same as a sum (e.g., l6+la4) of the sixth length l6 of the ninth connection line CTL9 and the fourth auxiliary length la4 of the fourth auxiliary line AL4.

In an embodiment, a fringe capacitance value formed by the connection lines and the auxiliary line may be constant or substantially constant. As an example, a fourth fringe capacitance value Cfr4 formed by the first connection line CTL1, the fourth connection line CTL4, and the seventh connection line CTL7 may be the same or substantially the same as a fifth fringe capacitance value Cfr5 formed by the second connection line CTL2, the fifth connection line CTL5, the eighth connection line CTL8, and the third auxiliary line AL3. The fourth fringe capacitance value Cfr4 formed by the first connection line CTL1, the fourth connection line CTL4, and the seventh connection line CTL7 may be the same or substantially the same as a sixth fringe capacitance value Cfr6 formed by the third connection line CTL3, the sixth connection line CTL6, the ninth connection line CTL9, and the fourth auxiliary line AL4.

As a comparative example, the auxiliary lines may not be arranged at (e.g., in or on) the peripheral area. In this case, a fringe capacitance value formed between the connection lines may not be constant. The lengths of the connection lines in the first direction (e.g., the ±x direction) may be different from each other, and a fringe capacitance value formed between the connection lines may not be constant due to the different values (e.g., the different lengths). As an example, the fringe capacitance value formed by the first connection line CTL1, the fourth connection line CTL4, and the seventh connection line CTL7 becomes greater than a fringe capacitance value formed by the third connection line CTL3, the sixth connection line CTL6, and the ninth connection line CTL9. Thus, due to different fringe capacitance values between the connection lines and signal delay differences caused by the different fringe capacitance values, smudge defects in the horizontal lines may occur.

In comparison, the display apparatus 1 according to one or more embodiments may include the auxiliary lines respectively connected to the connection lines. In this case, as described above, because a fringe capacitance value formed by the connection lines and the auxiliary line may be constant or substantially constant, a deviation in a signal delay applied to the display area may be reduced, and smudge defects in the horizontal lines due to the signal delay may be prevented or substantially prevented.

Figure 7:
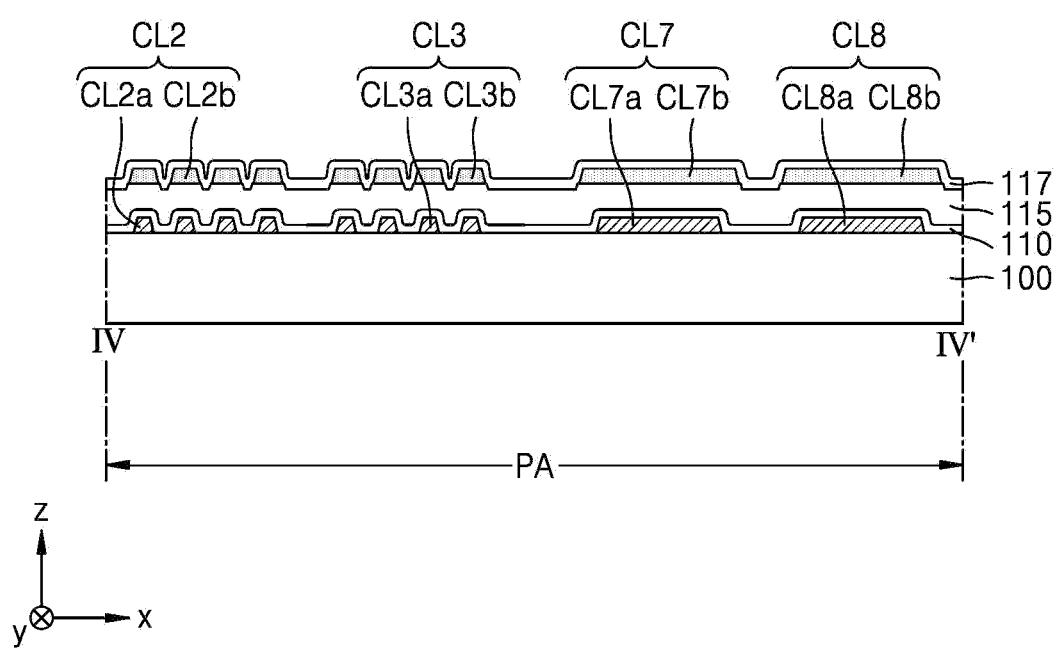
FIG. 7 is a cross-sectional view of an example of conductive lines taken along the line IV-IV' of FIG. 6.

FIG. 7 is a cross-sectional view of an example of conductive lines taken along the line IV-IV' of FIG. 6. In FIG. 7, the same reference numerals as those used in FIG. 5 denote the same or substantially the same elements and members, and thus, redundant description thereof may not be repeated.

Referring to FIG. 7, the plurality of conductive lines may each include a lower conductive line, and an upper conductive line electrically connected to the lower conductive line. The lower conductive line may overlap with the upper conductive line.

As an example, the second conductive line CL2 may include a second lower conductive line CL2a and a second upper conductive line CL2b overlapping with each other. The third conductive line CL3 may include a third lower conductive line CL3a and a third upper conductive line CL3b overlapping with each other. The seventh conductive line CL7 may include a seventh lower conductive line CL7a and a seventh upper conductive line CL7b overlapping with each other. The eighth conductive line CL8 may include an eighth lower conductive line CL8a and an eighth upper conductive line CL8b overlapping with each other. The second lower conductive line CL2a, the third lower conductive line CL3a, the seventh lower conductive line CL7a, and the eighth lower conductive line CL8a may be disposed between the substrate 100 and the buffer layer 110. The second upper conductive line CL2b, the third upper conductive line CL3b, the seventh upper conductive line CL7b, and the eighth upper conductive line CL8b may be disposed between the interlayer insulating layer 115 and the passivation layer 117.

Figure 8:
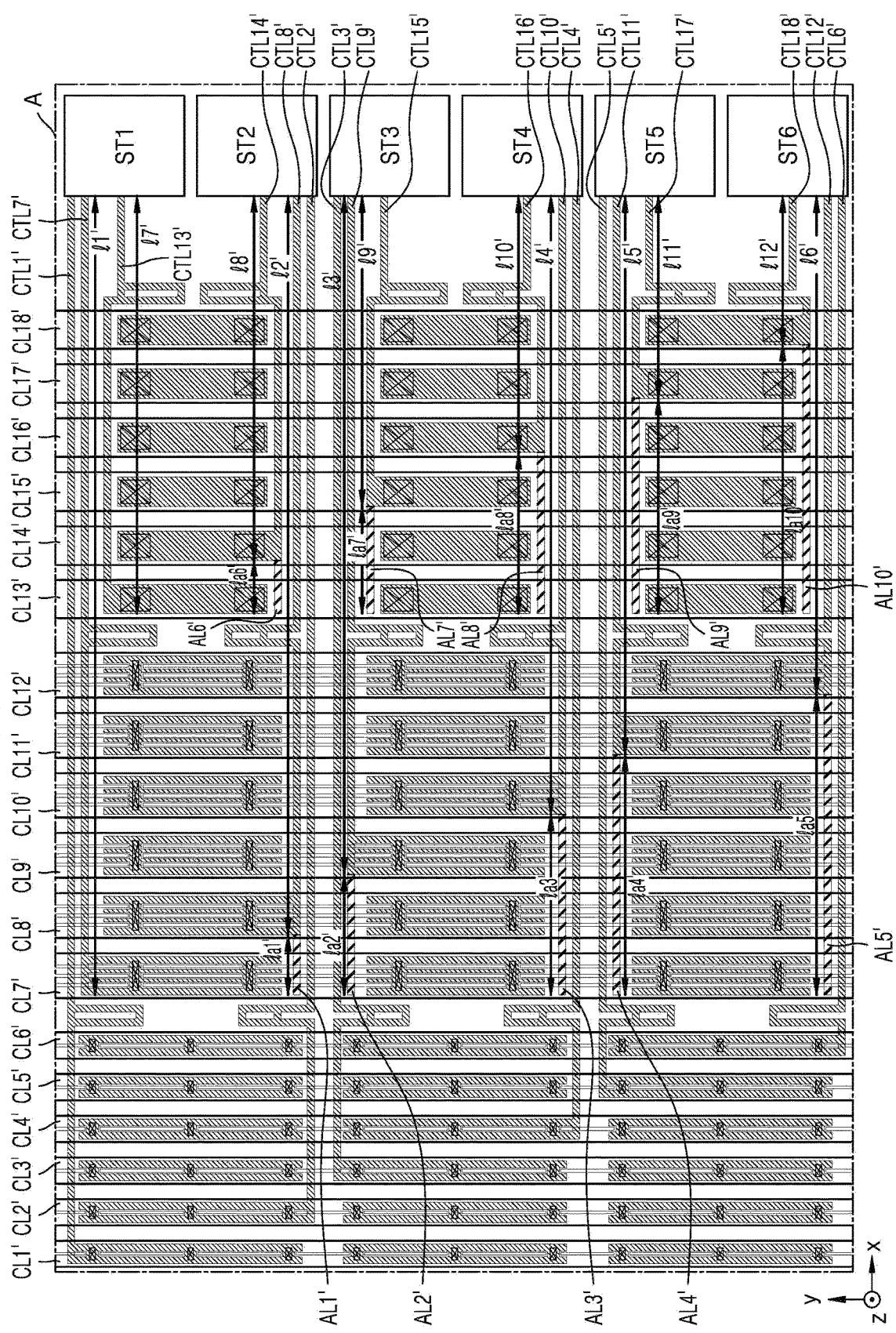
FIG. 8 is a schematic enlarged view of a portion of a display apparatus according to an embodiment.

FIG. 8 is a schematic enlarged view of a portion of a display apparatus according to an embodiment.

Referring to FIG. 8, the display apparatus 1 (e.g., see FIG. 1) may include a plurality of conductive lines, a plurality of stages, a plurality of connection lines, and a plurality of auxiliary lines arranged at (e.g., in or on) one side of the peripheral area PA.

The plurality of conductive lines may be arranged along the first direction (e.g., the ±x direction), and may extend in the second direction (e.g., the ±y direction). As an example, as shown in FIG. 8, first to 18-th conductive lines CL1', CL2', CL3', CL4', CL5', CL6', CL7', CL8', CL9', CL10', CL11', CL12', CL13', CL14', CL15', CL16', CL17', and CL18' may be sequentially arranged along the first direction (e.g., the ±x direction), and may each extend in the second direction (e.g., the ±y direction). As described above with reference to FIG. 4, the plurality of conductive lines may each include a lower conductive line, and an upper conductive line electrically connected to the lower conductive line. The lower conductive line may overlap with the upper conductive line.

The plurality of stages may be arranged along the second direction (e.g., the ±y direction). A plurality of connection lines may extend or substantially extend in the first direction (e.g., the ±x direction), and may connect the plurality of conductive lines to the plurality of stages. As an example, a first connection line CTL1', a seventh connection line CTL7', and a 13-th connection line CTL13' may extend or substantially extend in the first direction (e.g., the ±x direction), and may connect the first conductive line CL1', the seventh conductive line CL7', and the 13-th conductive line CL13', respectively, to the first stage ST1. A second connection line CTL2', an eighth connection line CTL8', and a 14-th connection line CTL14' may extend or substantially extend in the first direction (e.g., the ±x direction), and may connect the second conductive line CL2', the eighth conductive line CL8', and the 14-th conductive line CL14', respectively, to the second stage ST2. A third connection line CTL3', a ninth connection line CTL9', and a 15-th connection line CTL15' may extend or substantially extend in the first direction (e.g., the ±x direction), and may connect the third conductive line CL3', the ninth conductive line CL9', and the 15-th conductive line CL15', respectively, to the third stage ST3. A fourth connection line CTL4', a tenth connection line CTL10', and a 16-th connection line CTL16' may extend or substantially extend in the first direction (e.g., the ±x direction), and may connect the fourth conductive line CL4', the tenth conductive line CL10', and the 16-th conductive line CL16', respectively, to the fourth stage ST4. A fifth connection line CTL5', an 11-th connection line CTL11', and a 17-th connection line CTL17' may extend or substantially extend in the first direction (e.g., the ±x direction), and may connect the fifth conductive line CL5', the 11-th conductive line CL11', and the 17-th conductive line CL17', respectively, to the fifth stage ST5. A sixth connection line CTL6', a 12-th connection line CTL12', and an 18-th connection line CTL18' may extend or substantially extend in the first direction (e.g., the ±x direction), and may connect the sixth conductive line CL6', the 12-th conductive line CL12', and the 18-th conductive line CL18', respectively, to the sixth stage ST6.

The plurality of conductive lines may correspond to clock signal lines of FIG. 3. As an example, the first to sixth conductive lines CL1', CL2', CL3', CL4', CL5', and CL6' may correspond to the carry signal lines CR of FIG. 3, the 7-th to 12-th conductive lines CL7', CL8', CL9', CL10', CL11', and CL12' may correspond to one of the scan clock signal lines SC and the sensing clock signal lines SS of FIG. 3, and the 13-th to 18-th conductive lines CL13', CL14', CL15', CL16', CL17', and CL18' may correspond to others of the scan clock signal lines SC and the sensing clock signal lines SS of FIG. 3. The first to sixth conductive lines CL1', CL2', CL3', CL4', CL5', and CL6' may be configured to transfer the carry clock signals CLK_CR of FIG. 3 to the first to sixth stages ST1, ST2, ST3, ST4, ST5, and ST6, respectively, through the first to sixth connection lines CTL1', CTL2', CTL3', CTL4', CTL5', and CTL6'. The seventh to 12-th conductive lines CL7', CL8', CL9', CL10', CL11', and CL12' may be configured to transfer one of the scan clock signal lines CLK_SC and the sensing clock signal lines CLK_SS of FIG. 3 to the first to sixth stages ST1, ST2, ST3, ST4, ST5, and ST6, respectively, through the seventh to 12-th connection lines CTL7', CTL8', CTL9', CTL10', CTL11', and CTL12'. The 13-th to 18-th conductive lines CL13', CL14', CL15', CL16', CL17', and CL18' may be configured to transfer the other of the scan clock signal lines CLK_SC and the sensing clock signal lines CLK_SS of FIG. 3 to the first to sixth stages ST1, ST2, ST3, ST4, ST5, and ST6, respectively, through the 13-th to 18-th connection lines CTL13', CTL14', CTL15', CTL16', CTL17', and CTL18'. The first to sixth stages ST1, ST2, ST3, ST4, ST5, and ST6 may be configured to output scan signals (e.g., see SCn in FIG. 2) based on the scan clock signals CLK_SC, and may output sensing signals (e.g., see SSn in FIG. 2) based on the sensing clock signals CLK_SS.

In an embodiment, as shown in FIG. 8, the plurality of connection lines may each have at least one bent portion. While the plurality of connection lines may have the at least one bent portion, it may be considered that the plurality of connection lines extend in the first direction (e.g., the ±x direction).

In an embodiment, the plurality of connection lines in the first direction (e.g., the ±x direction) may be different from one another. As an example, a first length l1' of the seventh connection line CTL7' in the first direction (e.g., the ±x direction) may be greater than a second length l2' of the eighth connection line CTL8' in the first direction (e.g., the ±x direction). The second length l2' of the eighth connection line CTL8' may be greater than a third length l3' of the ninth connection line CTL9' in the first direction (e.g., the ±x direction). The third length l3' of the ninth connection line CTL9' may be greater than a fourth length l4' of the tenth connection line CTL10' in the first direction (e.g., the ±x direction). The fourth length l4' of the tenth connection line CTL10' may be greater than a fifth length l5' of the 11-th connection line CTL11' in the first direction (e.g., the ±x direction). The fifth length l5' of the 11-th connection line CTL11' may be greater than a sixth length l6' of the 12-th connection line CTL12' in the first direction (e.g., the ±x direction). A seventh length l7' of the 13-th connection line CTL13' in the first direction (e.g., the ±x direction) may be greater than an eighth length l8' of the 14-th connection line CTL14' in the first direction (e.g., the ±x direction). The eighth length l8' of the 14-th connection line CTL14' may be greater than a ninth length l9' of the 15-th connection line CTL15' in the first direction (e.g., the ±x direction). The ninth length l9' of the 15-th connection line CTL15' may be greater than a tenth length l10' of the 16-th connection line CTL16' in the first direction (e.g., the ±x direction). The tenth length l10' of the 16-th connection line CTL16' may be greater than a 11-th length l11' of the 17-th connection line CTL17' in the first direction (e.g., the ±x direction). The 11-th length l11' of the 17-th connection line CTL17' may be greater than a 12-th length l12' of the 18-th connection line CTL18' in the first direction (e.g., the ±x direction).

A plurality of auxiliary lines may extend in the first direction (e.g., the ±x direction) from the seventh conductive line CL7' and/or the 13-th conductive line CL13', and be connected to some of the connection lines. As an example, a first auxiliary line AL1' may extend in the first direction (e.g., the ±x direction) from the seventh conductive line CL7', and may be connected to the eighth connection line CTL8'. A second auxiliary line AL2' may extend in the first direction (e.g., the ±x direction) from the seventh conductive line CL7', and may be connected to the ninth connection line CTL9'. A third auxiliary line AL3' may extend in the first direction (e.g., the ±x direction) from the seventh conductive line CL7', and may be connected to the tenth connection line CTL10'. A fourth auxiliary line AL4' may extend in the first direction (e.g., the ±x direction) from the seventh conductive line CL7', and may be connected to the 11-th connection line CTL11'. A fifth auxiliary line AL5' may extend in the first direction (e.g., the ±x direction) from the seventh conductive line CL7', and may be connected to the 12-th connection line CTL12'. The first auxiliary line AL1' may be integrally connected to the eighth connection line CTL8'. The second auxiliary line AL2' may be integrally connected to the ninth connection line CTL9'. The first auxiliary line AL3' may be integrally connected to the tenth connection line CTL10'. The fourth auxiliary line AL4' may be integrally connected to the 11-th connection line CTL11'. The fifth auxiliary line AL5' may be integrally connected to the 12-th connection line CTL12'.

A sixth auxiliary line AL6' may extend in the first direction (e.g., the ±x direction) from the 13-th conductive line CL13', and may be connected to the 14-th connection line CTL14'. A seventh auxiliary line AL7' may extend in the first direction (e.g., the ±x direction) from the 13-th conductive line CL13', and may be connected to the 15-th connection line CTL15'. An eighth auxiliary line AL8' may extend in the first direction (e.g., the ±x direction) from the 13-th conductive line CL13', and may be connected to the 16-th connection line CTL16'. A ninth auxiliary line AL9' may extend in the first direction (e.g., the ±x direction) from the 13-th conductive line CL13', and may be connected to the 17-th connection line CTL17'. A tenth auxiliary line AL10' may extend in the first direction (e.g., the ±x direction) from the 13-th conductive line CL13', and may be connected to the 18-th connection line CTL18'. The sixth auxiliary line AL6' may be integrally connected to the 14-th connection line CTL14'. The seventh auxiliary line AL7' may be integrally connected to the 15-th connection line CTL15'. The eighth auxiliary line AL8' may be integrally connected to the 16-th connection line CTL16'. The ninth auxiliary line AL9' may be integrally connected to the 17-th connection line CTL17'. The tenth auxiliary line AL10' may be integrally connected to the 18-th connection line CTL18'.

In an embodiment, the plurality of auxiliary lines in the first direction (e.g., the ±x direction) may be different from one another. As an example, a first auxiliary length la1' of the first auxiliary line AL1' in the first direction (e.g., the ±x direction) may be less than a second auxiliary length la2' of the second auxiliary line AL2' in the first direction (e.g., the ±x direction). The second auxiliary length la2' of the second auxiliary line AL2' may be less than a third auxiliary length la3' of the third auxiliary line AL3' in the first direction (e.g., the ±x direction). The third auxiliary length la3' of the third auxiliary line AL3' may be less than a fourth auxiliary length la4' of the fourth auxiliary line AL4' in the first direction (e.g., the ±x direction). The fourth auxiliary length la4' of the fourth auxiliary line AL4' may be less than a fifth auxiliary length la5' of the fifth auxiliary line AL5' in the first direction (e.g., the ±x direction).

The sixth auxiliary length la6' of the sixth auxiliary line AL6' may be less than a seventh auxiliary length la7' of the seventh auxiliary line AL7' in the first direction (e.g., the ±x direction). The seventh auxiliary length la7' of the seventh auxiliary line AL7' may be less than an eighth auxiliary length la8' of the eighth auxiliary line AL8' in the first direction (e.g., the ±x direction). The eighth auxiliary length la8' of the eighth auxiliary line AL8' may be less than a ninth auxiliary length la9' of the ninth auxiliary line AL9' in the first direction (e.g., the ±x direction). The ninth auxiliary length la9' of the ninth auxiliary line AL9' may be less than a tenth auxiliary length la10' of the tenth auxiliary line AL10' in the first direction (e.g., the ±x direction).

In an embodiment, a sum of the length of the connection line and the length of the auxiliary line in the first direction (e.g., the ±x direction) may be constant or substantially constant. As an example, the first length l1' of the seventh connection line CTL7' may be the same or substantially the same as a sum (e.g., l2'+la1') of the second length l2' of the eighth connection line CTL8' and the first auxiliary length la1' of the first auxiliary line AL1'. A sum (e.g., l2'+la1') of the second length l2' of the eighth connection line CTL8' and the first auxiliary length la1' of the first auxiliary line AL1' may be the same or substantially the same as a sum (e.g., l3'+la2') of the third length l3' of the ninth connection line CTL9' and the second auxiliary length la2' of the second auxiliary line AL2'. A sum (e.g., l3'+la2') of the third length l3' of the ninth connection line CTL9' and the second auxiliary length la2' of the second auxiliary line AL2' may be the same or substantially the same as a sum (e.g., l4'+la3') of the fourth length l4' of the tenth connection line CTL10' and the third auxiliary length la3' of the third auxiliary line AL3'. A sum (e.g., l4'+la3') of the fourth length l4' of the tenth connection line CTL10' and the third auxiliary length la3' of the third auxiliary line AL3' may be the same or substantially the same as a sum (e.g., l5'+la4') of the fifth length l5' of the 11-th connection line CTL11' and the fourth auxiliary length la4' of the fourth auxiliary line AL4'. A sum (e.g., l5'+la4') of the fifth length l5' of the 11-th connection line CTL11' and the fourth auxiliary length la4' of the fourth auxiliary line AL4' may be the same or substantially the same as a sum (e.g., l6'+la5') of the sixth length l6' of the 12-th connection line CTL12' and the fifth auxiliary length la5' of the fifth auxiliary line AL5'.

A seventh length l7' of the 13-th connection line CTL13 may be the same or substantially the same as a sum (e.g., l8'+la6') of the eighth length l8' of the 14-th connection line CTL14' and the sixth auxiliary length la6' of the sixth auxiliary line AL6'. A sum (e.g., l8'+la6') of the eighth length l8' of the 14-th connection line CTL14' and the sixth auxiliary length la6' of the sixth auxiliary line AL6' may be the same or substantially the same as a sum (e.g., l9'+la7') of the ninth length l9' of the 15-th connection line CTL15' and the seventh auxiliary length la7' of the seventh auxiliary line AL7'. A sum (e.g., l9'+la7') of the ninth length l9' of the 15-th connection line CTL15' and the seventh auxiliary length la7' of the seventh auxiliary line AL7' may be the same or substantially the same as a sum (e.g., l10'+la8') of the tenth length l10' of the 16-th connection line CTL16' and the eighth auxiliary length la8' of the eighth auxiliary line AL8'. A sum (e.g., l10'+la8') of the tenth length l10' of the 16-th connection line CTL16' and the eighth auxiliary length la8' of the eighth auxiliary line AL8' may be the same or substantially the same as a sum (e.g., l11'+la9') of the 11-th length l11' of the 17-th connection line CTL17' and the ninth auxiliary length la9' of the ninth auxiliary line AL9'. A sum (e.g., l11'+la9') of the 11-th length l11' of the 17-th connection line CTL17' and the ninth auxiliary length la9' of the ninth auxiliary line AL9' may be the same or substantially the same as a sum (e.g., l12'+la10') of the 12-th length l12' of the 18-th connection line CTL18' and the tenth auxiliary length la10' of the tenth auxiliary line AL10'.

In an embodiment, a fringe capacitance value formed by the connection lines and the auxiliary line may be constant or substantially constant. As an example, a fringe capacitance value formed by the first connection line CTL1' and the seventh connection line CTL7' may be the same or substantially the same as a fringe capacitance value formed by the second connection line CTL2', the eighth connection line CTL8', and the first auxiliary line AL1'. A fringe capacitance value formed by the second connection line CTL2', the eighth connection line CTL8', and the first auxiliary line AL1' may be the same or substantially the same as a fringe capacitance value formed by the third connection line CTL3', the ninth connection line CTL9', and the second auxiliary line AL2'. A fringe capacitance value formed by the third connection line CTL3', the ninth connection line CTL9', and the second auxiliary line AL2' may be the same or substantially the same as a fringe capacitance value formed by the fourth connection line CTL4', the tenth connection line CTL10', and the third auxiliary line AL3'. A fringe capacitance value formed by the fourth connection line CTL4', the tenth connection line CTL10', and the third auxiliary line AL3' may be the same or substantially the same as a fringe capacitance value formed by the fifth connection line CTL5', the 11-th connection line CTL11', and the fourth auxiliary line AL4'. A fringe capacitance value formed by the fifth connection line CTL5', the 11-th connection line CTL11', and the fourth auxiliary line AL4' may be the same or substantially the same as a fringe capacitance value formed by the sixth connection line CTL6', the 12-th connection line CTL12', and the fifth auxiliary line AL5'.

A fringe capacitance value formed by the first connection line CTL1', the seventh connection line CTL7', and the 13-th connection line CTL13' may be the same or substantially the same as a fringe capacitance value formed by the second connection line CTL2', the eighth connection line CTL8', the 14-th connection line CTL14', and the sixth auxiliary line AL6'. A fringe capacitance value formed by the second connection line CTL2', the eighth connection line CTL8', the 14-th connection line CTL14', and the sixth auxiliary line AL6' may be the same or substantially the same as a fringe capacitance value formed by the third connection line CTL3', the ninth connection line CTL9', the 15-th connection line CTL15', and the seventh auxiliary line AL7'. A fringe capacitance value formed by the third connection line CTL3', the ninth connection line CTL9', the 15-th connection line CTL15', and the seventh auxiliary line AL7' may be the same or substantially the same as a fringe capacitance value formed by the fourth connection line CTL4', the tenth connection line CTL10', the 16-th connection line CTL16', and the eighth auxiliary line AL8'. A fringe capacitance value formed by the fourth connection line CTL4', the tenth connection line CTL10', the 16-th connection line CTL16', and the eighth auxiliary line AL8' may be the same or substantially the same as a fringe capacitance value formed by the fifth connection line CTL5', the 11-th connection line CTL11', the 17-th connection line CTL17', and the ninth auxiliary line AL9'. A fringe capacitance value formed by the fifth connection line CTL5', the 11-th connection line CTL11', the 17-th connection line CTL17', and the ninth auxiliary line AL9' may be the same or substantially the same as a fringe capacitance value formed by the sixth connection line CTL6', the 12-th connection line CTL12', the 18-th connection line CTL18', and the tenth auxiliary line AL10'.

Figure 9:
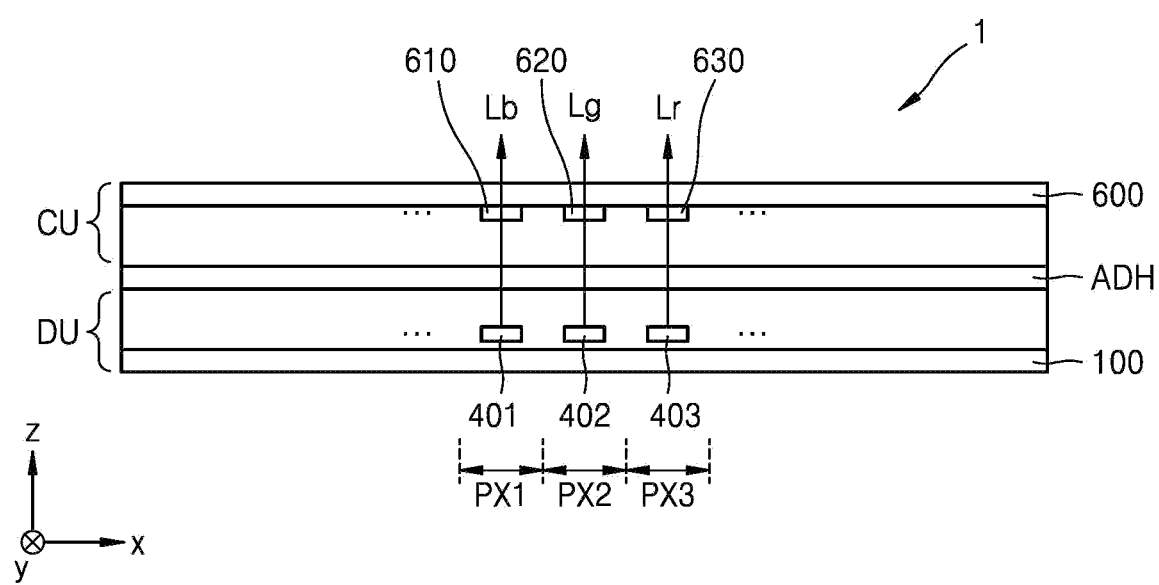
FIG. 9 is a schematic cross-sectional view of a display apparatus according to an embodiment.

FIG. 9 is a schematic cross-sectional view of the display apparatus 1 according to an embodiment.

Referring to FIG. 9, the display apparatus 1 may include a display unit (e.g., a display or a touch-display) DU, and a color filter unit (e.g., a color filter) CU facing the display unit DU. The display unit DU may include a first pixel PX1, a second pixel PX2, and a third pixel PX3 arranged at (e.g., in or on) the substrate 100. The first pixel PX1, the second pixel PX2, and the third pixel PX3 may be pixels for emitting light of different colors from each other at (e.g., in or on) the substrate 100. As an example, the first pixel PX1 may be configured to emit blue light Lb, the second pixel PX2 may be configured to emit green light Lg, and the third pixel PX3 may be configured to emit red light Lr.

The first pixel PX1, the second pixel PX2, and the third pixel PX3 may include a first light-emitting element 401, a second light-emitting element 402, and a third light-emitting element 403, respectively, each including an organic light-emitting diode OLED. In an embodiment, the first light-emitting element 401, the second light-emitting element 402, and the third light-emitting element 403 may each be configured to emit blue light. In another embodiment, the first light-emitting element 401, the second light-emitting element 402, and the third light-emitting element 403 may be configured to respectively emit blue light Lb, green light Lg, and red light Lr.

The color filter unit CU may include a first filter portion 610, a second filter portion 620, and a third filter portion 630. Light emitted from the first light-emitting element 401, the second light-emitting element 402, and the third light-emitting element 403 may pass through the first filter portion 610, the second filter portion 620, and the third filter portion 630, respectively, to be emitted as blue light Lb, green light Lg, and red light Lr.

The first filter portion 610, the second filter portion 620, and the third filter portion 630 may be located directly on an upper substrate 600. The first filter portion 610 may include a transmissive layer 619 (e.g., see FIG. 10), and a first-color color filter layer 611, which will be described in more detail below with reference to FIG. 11. The second filter portion 620 may include a second-color quantum dot layer 629 (e.g., see FIG. 10), and a second-color color filter layer 621, which will be described in more detail below with reference to FIG. 11. The third filter portion 630 may include a third-color quantum dot layer 639 (e.g., see FIG. 10), and a third-color color filter layer 631, which will be described in more detail below with reference to FIG. 11.

In this case, when the first filter portion 610, the second filter portion 620, and the third filter portion 630 are located directly on the upper substrate 600, it may mean that the color filter unit CU is manufactured by directly forming the first filter portion 610, the second filter portion 620, and the third filter portion 630 on the upper substrate 600. Then, with the first filter portion 610, the second filter portion 620, and the third filter portion 630 facing the first pixel PX1, the second pixel PX2, and the third pixel PX3, the display unit DU may be bonded (e.g., connected or attached) to the color filter unit CU. In this case, the number of substrates included in the display apparatus 1 may be 2.

FIG. 9 illustrates that the display unit DU is bonded to the color filter unit CU through an adhesive layer ADH. The adhesive layer ADH may be an optically clear adhesive (OCA), but is not limited thereto, and the adhesive layer ADH may be omitted as needed or desired. In another embodiment, the adhesive layer ADH may include (e.g., may be) a filler 700 (e.g., see FIG. 11), and may serve as a buffering function against external pressure and/or the like. The filler 700 may include an organic material, such as methyl silicone, phenyl silicone, polyimide and/or the like.

While FIG. 9 illustrates that the first filter portion 610, the second filter portion 620, and the third filter portion 630 are disposed on the upper substrate 600, in another embodiment, the first filter portion 610, the second filter portion 620, and the third filter portion 630 may be disposed on the display unit DU. As an example, an encapsulation layer may be disposed on the first light-emitting element 401, the second light-emitting element 402, and the third light-emitting element 403. In this case, the first filter portion 610, the second filter portion 620, and the third filter portion 630 may be disposed on the encapsulation layer. The transmissive layer 619, the second-color quantum dot layer 629, the third-color quantum dot layer 639, the first-color color filter layer 611, the second-color color filter layer 621, and the third-color color filter layer 631 may be disposed on the encapsulation layer. First, the transmissive layer 619, the second-color quantum dot layer 629, and the third-color quantum dot layer 639 may be disposed on the encapsulation layer, and then, the first-color color filter layer 611, the second-color color filter layer 621, and the third-color color filter layer 631 may be disposed. In this case, the upper substrate 600 may be omitted, and the number of substrates included in the display apparatus 1 may be 1.

Figure 10:
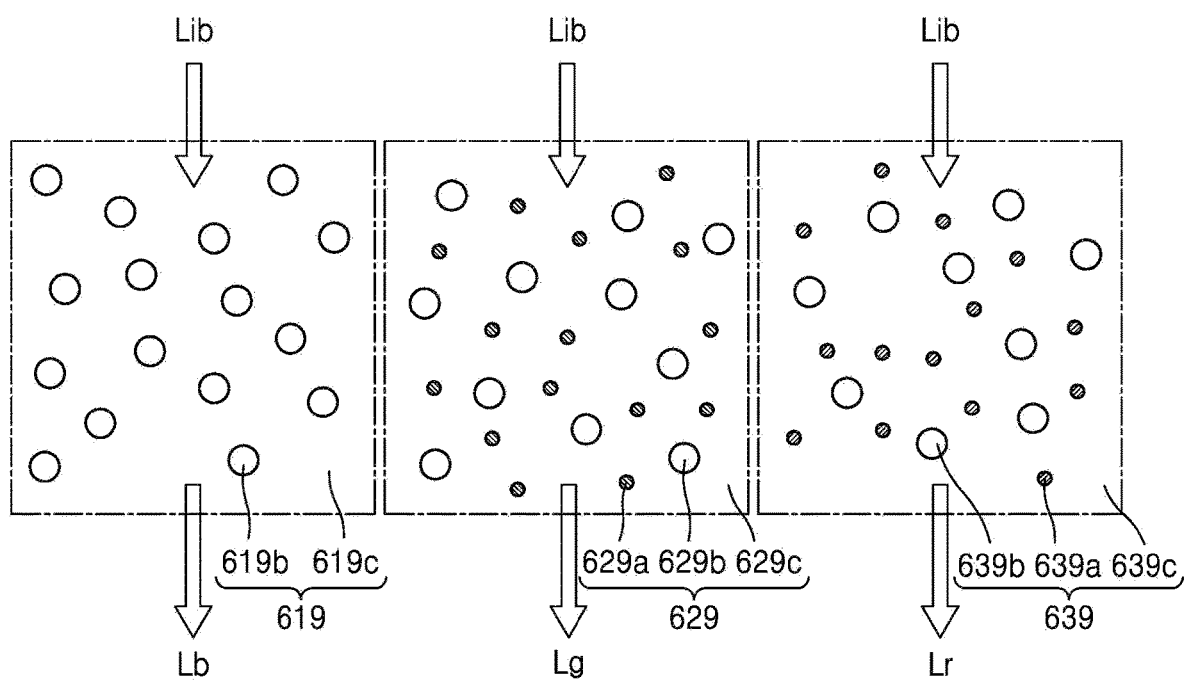
FIG. 10 is a schematic enlarged view of a portion of a display apparatus according to an embodiment.

FIG. 10 is a schematic enlarged view of a portion of the display apparatus 1 according to an embodiment. FIG. 10 is an enlarged view of the transmissive layer 619, the second-color quantum dot layer 629, and the third-color quantum dot layer 639.

Referring to FIG. 10, the transmissive layer 619 may be configured to transmit blue incident light Lib, and emit blue light Lb in a direction towards the upper substrate 600 (e.g., see FIG. 9). The transmissive layer 619 may include a first photosensitive polymer 619c, in which first scattering particles 619b are dispersed.

The first photosensitive polymer 619c may include an organic material having a suitable light transmittance, for example, such as silicon resin, epoxy resin, and/or the like. The first scattering particles 619b may be configured to scatter and emit the blue incident light Lib as the blue light Lb, and may include $TiO_2$ or suitable metal particles.

The second-color quantum dot layer 629 may be configured to convert blue incident light Lib to green light Lg. The second-color quantum dot layer 629 may include a second photosensitive polymer 629c, in which first quantum dots 629a and second scattering particles 629b are dispersed.

The first quantum dots 629a may be excited by the blue incident light Lib, and may be configured to emit green light Lg isotropically. The green light Lg has a greater wavelength than the wavelength of the blue light Lb. The second photosensitive polymer 629c may include an organic material having a suitable light transmittance, and may include the same material as the material of the first photosensitive polymer 619c. The second scattering particles 629b allow more first quantum dots 629a to be excited by scattering the blue incident light Lib that is not absorbed by the first quantum dots 629a. Accordingly, the second scattering particles 629b may increase a color conversion rate of the second-color quantum dot layer 629. The second scattering particles 629b may include the same material as the material of the first scattering particles 619b.

The third-color quantum dot layer 639 may be configured to convert blue incident light Lib to red light Lr. The third-color quantum dot layer 639 may include a third photosensitive polymer 639c, in which second quantum dots 639a and third scattering particles 639b are dispersed.

The second quantum dots 639a may be excited by the blue incident light Lib, and may be configured to emit red light Lr isotropically. The red light Lr has a greater wavelength than the wavelength of the blue light Lb. The third photosensitive polymer 639c may include an organic material having a suitable light transmittance, and may include the same material as the material of the first photosensitive polymer 619c. The third scattering particles 639b allow more second quantum dots 639a to be excited by scattering the blue incident light Lib that is not absorbed by the second quantum dots 639a. Accordingly, the third scattering particles 639b may increase a color conversion rate of the third-color quantum dot layer 639. The third scattering particles 639b may include the same material as the material of the first scattering particles 619b.

As described above, the second-color quantum dot layer 629 and the third-color quantum dot layer 639 may each include a quantum dot material. A core of the quantum dot may be one of a Group II-Group VI compound, a Group III-Group V compound, a Group IV-Group VI compound, a Group IV element, a Group IV compound, and/or a suitable combination thereof.

A Group II-VI compound may include one of a two-element compound including one of CdSe, CdTe, ZnS, ZnSe, ZnTe, ZnO, HgS, HgSe, HgTe, MgSe, MgS, and a mixture thereof; a three-element compound including one of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including one of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A Group III-V compound may include one of a two-element compound including one of GaN, GaP, GaAs, GaSb, AlN, AlP, AlAs, AlSb, InN, InP, InAs, InSb, and a mixture thereof; a three-element compound including one of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound including one of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A Group IV-VI compound may include one of a two-element compound including one of SnS, SnSe, SnTe, PbS, PbSe, PbTe, and a mixture thereof; a three-element compound including one of SnSeS, SnSeTe, SnSTe, PbSeS, PbSeTe, PbSTe, SnPbS, SnPbSe, SnPbTe, and a mixture thereof; and a four-element compound including one of SnPbSSe, SnPbSeTe, SnPbSTe, and a mixture thereof. A Group IV element may include one of Si, Ge, and a mixture thereof. A Group IV compound may include a two-element compound including one of SiC, SiGe, and a mixture thereof.

In this case, the two-element compound, the three-element compound, or the four-element compound may be present inside a particle at a uniform or substantially uniform concentration, or may be divided into states with partially different concentration distributions and present in the same particle. In addition, a core-shell structure in which one quantum dot surrounds (e.g., around a periphery of) another quantum dot may be provided. An interface between the core and the shell may have a concentration gradient in which the concentration of an element existing in the shell is reduced toward the center.

In some embodiments, a quantum dot may have a core-shell structure including a core and a shell. The core may include a nano crystal, and the shell may surround (e.g., around a periphery of) the core. The shell of a quantum dot may serve as a protective layer that prevents or substantially prevents a chemical change of the core to maintain or substantially maintain a semiconductor characteristic, and/or may serve as a charging layer for giving an electrophoretic characteristic to the quantum dot. The shell may include a single layer or multi-layers. An interface between the core and the shell may have a concentration gradient in which the concentration of an element existing in the shell is reduced toward the center. Examples of the shell of the quantum dot include an oxide of a metal or a non-metal, a semiconductor compound, or a suitable combination thereof.

As an example, the oxide of the metal or the non-metal may include a two-element compounding including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a three-element compound including $MgAl_2O_4$, $CoFe_2O_4$, $NiFe_2O_4$, and/or $CoMn_2O_4$, but the present disclosure is not limited thereto.

In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb, but the present disclosure is not limited thereto.

A quantum dot may have a full width of half maximum (FWHM) of a light emission wavelength spectrum of 45 nm or less, about 40 nm or less, or about 30 nm or less. Within these ranges, color purity or color reproduction may be improved. In addition, because light emitted from the quantum dot is emitted in all directions, a viewing angle of light may be improved.

In addition, although the shape of the quantum dot is a shape generally used in the art and is not particularly limited, the shape of the quantum dot may include a spherical shape, a pyramid shape, or a multi-arm shape, or a cubic nano particle, a nano tube, a nano wire, a nano fiber, and/or a nano plate particle in various embodiments.

A quantum dot may be configured to control a color of emitted light according to the size of a particle thereof, and accordingly, the quantum dot may have various emission colors, such as blue, red, and/or green.

Figure 11:
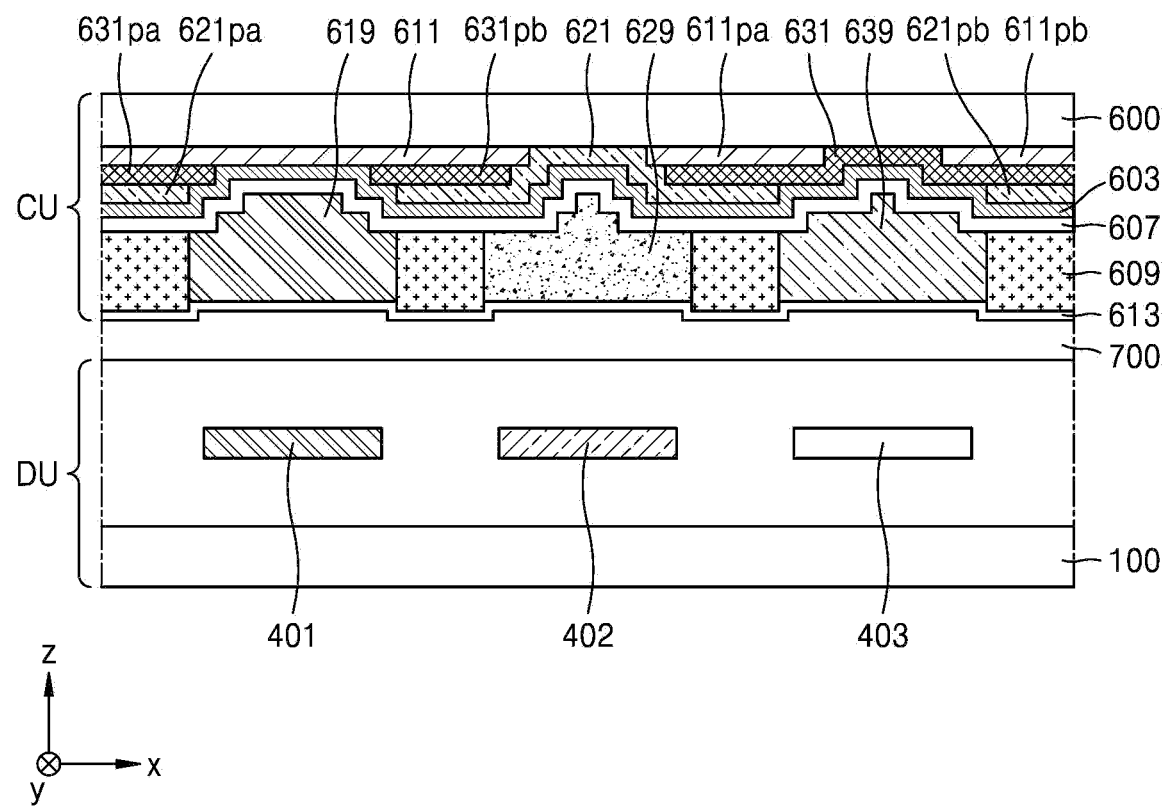
FIG. 11 is a schematic cross-sectional view of a display apparatus according to an embodiment.

FIG. 11 is a schematic cross-sectional view of the display apparatus 1 according to an embodiment.

Referring to FIG. 11, the display apparatus 1 (e.g., see FIG. 9) may include the display unit DU and the color filter unit CU. The filler 700 may be disposed between the display unit DU and the color filter unit CU.

The display unit DU may include the substrate 100. The display unit DU may further include the first light-emitting element 401, the second light-emitting element 402, and the third light-emitting element 403, each of which may be disposed on the substrate 100. The first light-emitting element 401, the second light-emitting element 402, and the third light-emitting element 403 may each include a first-color emission layer.

The color filter unit CU may include the upper substrate 600, the first-color color filter layer 611, the second-color color filter layer 621, the third-color color filter layer 631, a low-refractive index layer 603, a first capping layer 607, an insulating layer 609, the transmissive layer 619, the second-color quantum dot layer 629, the third-color quantum dot layer 639, and a second capping layer 613.

Hereinafter, for convenience, in the display apparatus 1 may be described in more detail according to a stacking order (e.g., in the −z direction) on the upper substrate 600.

The upper substrate 600 may include a glass material, a ceramic material, a metal, or a flexible or bendable material. In the case where the upper substrate 600 is flexible or bendable, the upper substrate 600 may include a polymer resin including polyethersulfone, polyacrylate, polyetherimide, polyethylene naphthalate, polyethylene terephthalate, polyphenylene sulfide, polyarylate, polyimide, polycarbonate, and/or cellulose acetate propionate. The upper substrate 600 may have a single-layer structure or a multi-layered structure including one or more of the above materials. The upper substrate 600 may further include an inorganic layer in the case of the multi-layered structure. In an embodiment, the upper substrate 600 may have a structure (e.g., a multi-layered structure) of an organic material/an inorganic material/an organic material.

The first-color color filter layer 611 may be arranged on the upper substrate 600 to correspond to the first light-emitting element 401. The second-color color filter layer 621 may be arranged on the upper substrate 600 to correspond to the second light-emitting element 402. The third-color color filter layer 631 may be arranged on the upper substrate 600 to correspond to the third light-emitting element 403. In other words, when viewed in a direction (e.g., the ±z direction) perpendicular to or substantially perpendicular to the upper substrate 600 (e.g., in a plan view), the first-color color filter layer 611 may overlap with the first light-emitting element 401, the second-color color filter layer 621 may overlap with the second light-emitting element 402, and the third-color color filter layer 631 may overlap with the third light-emitting element 403.

The first-color color filter layer 611 may be configured to transmit light in a wavelength band (e.g., only light in a wavelength band) of about 450 nm to about 495 nm. The second-color color filter layer 621 may be configured to transmit light in a wavelength band (e.g., only light in a wavelength band) of about 495 nm to about 570 nm. The third-color color filter layer 631 may be configured to transmit light in a wavelength band (e.g., only light in a wavelength band) of about 630 nm to about 780 nm. The first-color color filter layer 611, the second-color color filter layer 621, and the third-color color filter layer 631 may be configured to reduce external light reflection in the display apparatus 1.

As an example, when external light reaches the first-color color filter layer 611, only light in a wavelength band determined (e.g., set) in advance as described above may pass through the first-color color filter layer 611, and light in other wavelength bands are absorbed in the first-color color filter layer 611. Accordingly, from among the external light incident to the display apparatus 1, only light in the wavelength band determined (e.g., set) in advance passes through the first-color color filter layer 611 as described above, and a portion of the light is reflected by a conductive layer in the lower portion thereof (e.g., from the opposite electrode or the pixel electrode) and emitted to the outside again. As a result, because from among the external light incident to where the first light-emitting element 401 is located, only a portion of the external light is reflected, external light reflection may be reduced. The same is applicable to the second-color color filter layer 621 and the third-color color filter layer 631.

In an embodiment, as shown in FIG. 11, when viewed in a direction (e.g., the ±z direction) perpendicular to or substantially perpendicular to the upper substrate 600 (e.g., in a plan view), the first-color color filter layer 611 may at least partially overlap with the second-color color filter layer 621, and the second-color color filter layer 621 may at least partially overlap with third-color color filter layer 631.

A (3-1)st-color color filter pattern 631*pa* and a (2-1)st-color color filter pattern 621*pa* may be sequentially disposed on one side of the first-color color filter layer 611. A (3-2)nd-color color filter pattern 631*pb* may be disposed on another side of the first-color color filter layer 611 that at least partially overlaps with the second-color color filter layer 621. The (3-2)nd-color color filter pattern 631*pb* may be arranged between the first-color color filter layer 611 and the second-color color filter layer 621. The (2-1)st-color color filter pattern 621*pa* may perform the same or substantially the same role as a role of the second-color color filter layer 621, and the (3-1)st-color color filter pattern 631*pa* and the (3-2)nd-color color filter pattern 631*pb* may perform the same or substantially the same role as a role of the third-color color filter layer 631. In this case, one side of the first-color color filter layer 611, the (3-1)st-color color filter pattern 631*pa*, and the (2-1)st-color color filter pattern 621*pa* overlapping with one another in the ±z direction, may perform the same or substantially the same role as a role of a black matrix including carbon black and/or the like. Another side of the first-color color filter layer 611, the (3-2)nd-color color filter pattern 631*pb*, and one side of the second-color color filter layer 621 overlapping with one another in the ±z direction, may perform the same or substantially the same role as a role of the black matrix.

A (1-1)st-color color filter pattern 611*pa* may be arranged between one side of the third-color color filter layer 631 that at least partially overlaps with the second-color color filter layer 621 and the upper substrate 600. A (1-2)nd-color color filter pattern 611*pb* may be arranged between another side of the third-color color filter layer 631 and the upper substrate 600. A (2-2)nd-color color filter pattern 621*pb* may be disposed on another side of the third-color color filter layer 631. The (1-1)st-color color filter pattern 611*pa* and the (1-2)nd-color color filter pattern 611*pb* may perform the same or substantially the same role as a role of the first-color color filter layer 611. The (2-2)nd-color color filter pattern 621*pb* may perform the same or substantially the same role as a role of the second-color color filter layer 621. In this case, the (1-1)st-color color filter pattern 611*pa*, one side of the third-color color filter layer 631, and another side of the second-color color filter layer 621 overlapping with one another in the ±z direction, may perform the same or substantially the same role as a role of a black matrix. The (1-2)nd-color color filter pattern 611*pb*, another side of the third-color color filter layer 631, and the (2-2)nd-color color filter layer 621*pb* overlapping with one another in the ±z direction, may perform the same or substantially the same role as a role of a black matrix.

The low-refractive index layer 603 may be disposed on the first-color color filter layer 611, the second-color color filter layer 621, and the third-color color filter layer 631 to correspond to the first light-emitting element 401, the second light-emitting element 402, and the third light-emitting element 403. The first capping layer 607 may be disposed on the low-refractive index layer 603.

A refractive index of the low-refractive index layer 603 may be less than a refractive index of the first capping layer 607. In the case where the first capping layer 607 includes an inorganic material, such as silicon oxide, silicon nitride, silicon oxynitride, or the like, the refractive index of the first capping layer 607 may be about 1.4 to about 1.5. The refractive index of the low-refractive index layer 603 may be less than that of the first capping layer 607, for example, such as about 1.1 to about 1.3.

The first capping layer 607 may have one body to correspond to the first light-emitting element 401, the second light-emitting element 402, and the third light-emitting element 403. The first capping layer 607 may include an inorganic material, such as silicon oxide, silicon nitride, silicon oxynitride, and/or the like.

The transmissive layer 619 may be disposed on the first capping layer 607 to correspond to the first light-emitting element 401. The second-color quantum dot layer 629 may be disposed on the first capping layer 607 to correspond to the second light-emitting element 402. The third-color quantum dot layer 639 may be disposed on the first capping layer 607 to correspond to the third light-emitting element 403. Thus, the insulating layer 609 may be disposed on the first capping layer 607, and the insulating layer 609 may include openings corresponding to the first light-emitting element 401, the second light-emitting element 402, and the third light-emitting element 403, respectively. When the openings of the insulating layer 609 correspond to the first light-emitting element 401, the second light-emitting element 402, and the third light-emitting element 403, respectively, it may mean that, when viewed in the direction (e.g., the ±z direction) perpendicular to or substantially perpendicular to the substrate 100 (e.g., in a plan view), the openings overlap with the first light-emitting element 401, the second light-emitting element 402, and the third light-emitting element 403, respectively.

The insulating layer 609 may include various suitable materials, for example, an inorganic material such as silicon oxide, silicon nitride, and/or silicon oxynitride. As another example, the insulating layer 609 may include (e.g., may be) a black matrix, and may be a member configured to improve a color clarity and a contrast. The insulating layer 609 may include at least one of a black pigment, a black dye, and black particles. In an embodiment, the insulating layer 609 may include at least one of Cr or $CrO_X$, $Cr/CrO_X$, $Cr/CrO_X/$ $CrN_Y$, a resin (e.g., a carbon pigment, an RGB mixed pigment, or the like), graphite, a non-Cr-based material, and/or the like.

As described above with reference to FIG. 10, the transmissive layer 619 may include the first photosensitive polymer 619*c*, in which the first scattering particles 619*b* are dispersed. The second-color quantum dot layer 629 may include the second photosensitive polymer 629*c*, in which the second quantum dots 629*a* and the second scattering particles 629*b* are dispersed. the third-color quantum dot layer 639 may include the third photosensitive polymer 639*c*, in which the second quantum dots 639*a* and the third scattering particles 639*b* are dispersed.

The second capping layer 613 may be disposed on the transmissive layer 619, the second-color quantum dot layer 629, and the third-color quantum dot layer 639. The second capping layer 613 may have one body to correspond to the first light-emitting element 401, the second light-emitting element 402, and the third light-emitting element 403. The second capping layer 613 may include an inorganic material, such as silicon oxide, silicon nitride, silicon oxynitride and/or the like.

While the stacking order (e.g., in a −z direction) on the upper substrate 600 has been described in more detail above, in the case where the stacking order is described based on the substrate 100 (e.g., in a +z direction), the stacking order of the layers constituting the color filter unit CU may be expressed in a reverse order. As an example, it may be expressed that the first capping layer 607 is disposed on the transmissive layer 619, the second-color quantum dot layer 629, and the third-color quantum dot layer 639 to correspond to the first light-emitting element 401, the second light-emitting element 402, and the third light-emitting element 403. It may be expressed that the low-refractive index layer 603 is disposed on the first capping layer 607. The first-color color filter layer 611 may be disposed on the low-refractive index layer 603 to correspond to the first light-emitting element 401, the second-color color filter layer 621 may be disposed on the low-refractive index layer 603 to correspond to the second light-emitting element 402, and the third-color color filter layer 631 may be disposed on the low-refractive index layer 603 to correspond to the third light-emitting element 403.

While a display apparatus according to one or more embodiments of the present disclosure have been described, the present disclosure is not limited thereto. As an example, a method of manufacturing the display apparatus according to one or more embodiments may also fall within the spirit and scope of the present disclosure.

According to various embodiments described above, a deviation in a signal delay applied to the display area may be reduced. Accordingly, defects of the display apparatus may be prevented or reduced. However, the spirit and scope of the present disclosure are not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a substrate defining a display area, and a peripheral area outside the display area;
   first and second conductive lines sequentially located along a first direction on one side of the peripheral area, the first and second conductive lines each extending in a second direction crossing the first direction;
   first and second stages located along the second direction on one side of the peripheral area;
   a first connection line extending in the first direction, and connecting the first conductive line to the first stage;
   a second connection line extending in the first direction, and connecting the second conductive line to the second stage; and
   a first auxiliary line extending in the first direction from the first conductive line, and connected to the second connection line,
   wherein a first length of the first connection line in the first direction is greater than a second length of the second connection line in the first direction.

2. The display apparatus of claim 1, wherein the first length of the first connection line is equal to a sum of the second length of the second connection line and a first auxiliary length of the first auxiliary line in the first direction.

3. The display apparatus of claim 1, further comprising:
   a third conductive line between the second conductive line and the first and second stages, and extending in the second direction;
   a third stage on one side of the peripheral area;
   a third connection line extending in the first direction, and connecting the third conductive line to the third stage; and
   a second auxiliary line extending in the first direction from the first conductive line, and connected to the third connection line,
   wherein a first auxiliary length of the first auxiliary line in the first direction is less than a second auxiliary length of the second auxiliary line in the first direction.

4. The display apparatus of claim 3, wherein the second length of the second connection line is greater than a third length of the third connection line in the first direction.

5. The display apparatus of claim 3, wherein the first length of the first connection line is equal to a sum of the second length of the second connection line and the first auxiliary length of the first auxiliary line, and
   the first length of the first connection line is equal to a sum of a third length of the third connection line in the first direction and the second auxiliary length of the second auxiliary line in the first direction.

6. The display apparatus of claim 3, further comprising a plurality of pixels at the display area,
   wherein each of the plurality of pixels comprises:
   a light-emitting element having an anode and a cathode;
   a driving transistor configured to control a magnitude of a driving current flowing through the light-emitting element;
   a scan transistor configured to transfer a data voltage to a gate of the driving transistor in response to a scan signal; and
   a sensing transistor configured to transfer a sensing voltage or an initialization voltage to the anode of the light-emitting element in response to a sensing signal,
   wherein the first to third conductive lines are configured to transfer scan clock signals or sensing clock signals to the first to third stages, respectively, through the first to third connection lines, and
   wherein the first to third stages are configured to output scan signals or sensing signals, based on the scan clock signals or the sensing clock signals.

7. The display apparatus of claim 1, further comprising:
   third and fourth conductive lines sequentially located along the first direction on one side of the peripheral area, the third and fourth conductive lines each extending in the second direction;
   a third connection line extending in the first direction, and connecting the third conductive line to the first stage; and
   a fourth connection line extending in the first direction, and connecting the fourth conductive line to the second stage,
   wherein the first and second conductive lines are located between the third and fourth conductive lines and the first and second stages, and
   wherein a value of a first fringe capacitance formed between the first connection line and the third connection line is equal to a value of a second fringe capacitance formed between the second connection line, the first auxiliary line, and the fourth connection line.

8. The display apparatus of claim 1, further comprising:
   third and fourth conductive lines sequentially located along the first direction on one side of the peripheral area, the third and fourth conductive lines each extending in the second direction;
   a third connection line extending in the first direction, and connecting the third conductive line to the first stage;
   a fourth connection line extending in the first direction, and connecting the fourth conductive line to the second stage;
   a second auxiliary line extending in the first direction from the third conductive line, and connected to the fourth connection line; and
   a plurality of pixels at the display area,
   wherein the each of the plurality of pixels comprises:
   a light-emitting element having an anode and a cathode;
   a driving transistor configured to control a magnitude of a driving current flowing through the light-emitting element;
   a scan transistor configured to transfer a data voltage to a gate of the driving transistor in response to a scan signal; and
   a sensing transistor configured to transfer a sensing voltage or an initialization voltage to the anode of the light-emitting element in response to a sensing signal,
   wherein the first and second conductive lines are configured to transfer one of scan clock signals or sensing clock signals to the first and second stages, respectively, through the first and second connection lines,
   wherein the third and fourth conductive lines are configured to transfer another one from among the scan clock signals or the sensing clock signals to the first and second stages, respectively, through the third and fourth connection lines, and wherein the first and second stages are configured to output scan signals based on the scan clock signals, and sensing signals based on the sensing clock signals.

9. The display apparatus of claim 8, wherein the first length of the first connection line is equal to a sum of the second length of the second connection line and a first auxiliary length of the first auxiliary line in the first direction, and a third length of the third connection line in the first direction is equal to a sum of a fourth length of the fourth connection line in the first direction and a second auxiliary length of the second auxiliary line in the first direction.

10. The display apparatus of claim 8, further comprising:

fifth and sixth conductive lines sequentially located along the first direction on one side of the peripheral area, the fifth and sixth conductive lines each extending in the second direction;

a fifth connection line extending in the first direction, and connecting the fifth conductive line to the first stage; and a sixth connection line extending in the first direction, and connecting the sixth conductive line to the second stage, wherein the first and second conductive lines are located between the fifth and sixth conductive lines and the first and second stages, wherein the third and fourth conductive lines are located between the first and second conductive lines and the first and second stages, wherein a value of a first fringe capacitance formed by the first connection line and the fifth connection line is equal to a value of a second fringe capacitance formed by the second connection line, the first auxiliary line, and the sixth connection line, and wherein a value of a third fringe capacitance formed by the first connection line, the third connection line, and the fifth connection line is equal to a value of a fourth fringe capacitance formed by the second connection line, the fourth connection line, the second auxiliary line, and the sixth connection line.

11. The display apparatus of claim 1, further comprising:

a transistor at the display area, and comprising a semiconductor layer, and a gate electrode on the semiconductor layer;

a buffer layer between the substrate and the semiconductor layer; and an interlayer insulating layer on the gate electrode, wherein each of the first and second conductive lines comprises a lower conductive line and an upper conductive line, the lower conductive line being located between the substrate and the buffer layer, and the upper conductive line being located on the interlayer insulating layer to overlap with the lower conductive line and electrically connected to the lower conductive line.

12. The display apparatus of claim 11, wherein each of the lower conductive lines has a plurality of first openings exposing at least a portion of the substrate, and wherein each of the upper conductive lines has a plurality of second openings corresponding to the plurality of first openings, respectively.

13. The display apparatus of claim 11, wherein the first connection line, the second connection line, and the first auxiliary line are located at a same layer as that of the lower conductive line.

14. The display apparatus of claim 1, wherein the second connection line and the first auxiliary line are one body.

15. The display apparatus of claim 1, further comprising:

a first light-emitting element, a second light-emitting element, and a third light-emitting element at the display area, and each comprising a first-color emission layer;

a transmissive layer on the first light-emitting element;

a second-color quantum dot layer and a third-color quantum dot layer on the second light-emitting element and the third light-emitting element, respectively; and a first-color color filter layer, a second-color color filter layer, and a third-color color filter layer on the transmissive layer, the second-color quantum dot layer, and the third-color quantum dot layer, respectively.

16. A display apparatus comprising:

a substrate defining a display area, and a peripheral area outside the display area;

first to fourth conductive lines sequentially located along a first direction on one side of the peripheral area, the first to fourth conductive lines each extending in a second direction crossing the first direction;

first and second stages located along the second direction on one side of the peripheral area;

a first connection line extending in the first direction, and connecting the first conductive line to the first stage;

a second connection line extending in the first direction, and connecting the second conductive line to the second stage;

a third connection line extending in the first direction, and connecting the third conductive line to the first stage;

a fourth connection line extending in the first direction, and connecting the fourth conductive line to the second stage; and an auxiliary line extending in the first direction from the third conductive line, and connected to the fourth connection line, wherein a value of a first fringe capacitance formed between the first connection line and the third connection line is equal to a value of a second fringe capacitance formed between the second connection line, the fourth connection line, and the auxiliary line.

17. The display apparatus of claim 16, further comprising a plurality of pixels at the display area, wherein the each of the plurality of pixels comprises:

a light-emitting element having an anode and a cathode;

a driving transistor configured to control a magnitude of a driving current flowing through the light-emitting element;

a scan transistor configured to transfer a data voltage to a gate of the driving transistor in response to a scan signal; and a sensing transistor configured to transfer a sensing voltage or an initialization voltage to the anode of the light-emitting element in response to a sensing signal, wherein the first and second conductive lines are configured to transfer carry clock signals to the first and second stages, respectively, through the first and second connection lines, wherein the third and fourth conductive lines are configured to transfer scan clock signals or sensing clock signals to the first and second stages, respectively, through the third and fourth connection lines, and wherein the first and second stages are configured to output scan signals or sensing signals, based on the scan clock signals or the sensing clock signals.

18. The display apparatus of claim 16, wherein a first length of the first connection line in the first direction is greater than a second length of the second connection line in the first direction, and a third length of the third connection line in the first direction is equal to a sum of a fourth length of the fourth connection line in the first direction and an auxiliary length of the auxiliary line in the first direction.

19. The display apparatus of claim 16, wherein the fourth connection line and the auxiliary line are one body.

20. The display apparatus of claim 16, further comprising:

a first light-emitting element, a second light-emitting element, and a third light-emitting element at the display area, and each comprising a first-color emission layer;

a transmissive layer on the first light-emitting element;

a second-color quantum dot layer and a third-color quantum dot layer on the second light-emitting element and the third light-emitting element, respectively; and a first-color color filter layer, a second-color color filter layer, and a third-color color filter layer on the transmissive layer, the second-color quantum dot layer, and the third-color quantum dot layer, respectively.

* * * * *